US011629405B2

(12) United States Patent
Bulovic et al.

(10) Patent No.: US 11,629,405 B2
(45) Date of Patent: Apr. 18, 2023

(54) ALTERNATING MULTI-SOURCE VAPOR TRANSPORT DEPOSITION

(71) Applicant: Massachusetts Institute of Technology, Cambridge, MA (US)

(72) Inventors: Vladimir Bulovic, Lexington, MA (US); Maximilian Hoerantner, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 499 days.

(21) Appl. No.: 16/514,004

(22) Filed: Jul. 17, 2019

(65) Prior Publication Data
US 2020/0024733 A1   Jan. 23, 2020

Related U.S. Application Data

(60) Provisional application No. 62/699,824, filed on Jul. 18, 2018.

(51) Int. Cl.
| | |
|---|---|
| *C23C 16/455* | (2006.01) |
| *H01L 51/00* | (2006.01) |
| *C23C 16/30* | (2006.01) |
| *H01L 51/42* | (2006.01) |

(52) U.S. Cl.
CPC ............ *C23C 16/455* (2013.01); *C23C 16/30* (2013.01); *H01L 51/001* (2013.01); *H01L 51/4213* (2013.01)

(58) Field of Classification Search
None
See application file for complete search history.

(56) References Cited

U.S. PATENT DOCUMENTS

| | | |
|---|---|---|
| 6,337,102 B1 | 1/2002 | Forrest et al. |
| 7,119,046 B2 | 10/2006 | Ohno et al. |
| 7,431,968 B1 | 10/2008 | Shtein et al. |
| 7,780,787 B2 | 8/2010 | Nolan |
| 2003/0033978 A1* | 2/2003 | Zhao ................... C23C 16/4402 118/724 |

(Continued)

FOREIGN PATENT DOCUMENTS

| | | |
|---|---|---|
| CN | 106252460 A | 12/2016 |
| WO | WO-2013074345 A1 | 5/2013 |

(Continued)

OTHER PUBLICATIONS

Kitakawa et al. "Optical properties of organic-inorganic hybrid films prepared by the two step growth process" Journal of Luminescence, 129 (2009) 1036-1041 (Year: 2009).*

(Continued)

*Primary Examiner* — Mandy C Louie
(74) *Attorney, Agent, or Firm* — Foley Hoag LLP; Dana M. Gordon; Lawrence P. Tardibono

(57) ABSTRACT

Disclosed are vapor transport deposition systems and methods for alternating sequential vapor transport deposition of multi-component perovskite thin-films. The systems include multiple vaporizing sources that are mechanically or digitally controlled for high throughput deposition. Alternating sequential deposition provides faster sequential deposition, and allows for reduced material degradation due to different vapor temperatures.

24 Claims, 21 Drawing Sheets

(56) References Cited

U.S. PATENT DOCUMENTS

| | | | |
|---|---|---|---|
| 2003/0037731 A1* | 2/2003 | Shim | C23C 16/4485 118/726 |
| 2007/0054051 A1* | 3/2007 | Arai | C23C 14/042 427/248.1 |
| 2017/0148579 A1* | 5/2017 | Snaith | H01L 51/0002 |
| 2017/0226641 A1* | 8/2017 | Qi | C23C 14/24 |
| 2017/0229647 A1* | 8/2017 | Qi | C23C 14/548 |
| 2017/0268128 A1* | 9/2017 | Qi | C23C 16/52 |
| 2019/0003045 A1* | 1/2019 | Adjeroud | B01J 19/0073 |
| 2019/0119812 A1* | 4/2019 | Ding | C23C 16/30 |
| 2020/0024733 A1 | 1/2020 | Bulovic et al. | |

FOREIGN PATENT DOCUMENTS

| | | |
|---|---|---|
| WO | WO-2013171517 A1 | 11/2013 |
| WO | WO-2014045021 A1 | 3/2014 |
| WO | WO-2015/116297 A2 | 8/2015 |
| WO | WO-2016005758 A1 | 1/2016 |
| WO | WO-2016027450 A1 | 2/2016 |
| WO | WO-2017031193 A1 | 2/2017 |
| WO | WO-2017/043084 A1 | 3/2017 |
| WO | WO-2018/036193 A1 | 3/2018 |
| WO | WO-2020/018626 A1 | 1/2020 |

OTHER PUBLICATIONS

Chen et al., "Efficient and Uniform Planar-Type Perovskite Solar Cells by Simple Sequential Vacuum Deposition," Advanced Materials, 26(38): 6647-6652 (2014).

Hsiao et al., "Efficient All-Vacuum Deposited Perovskite Solar Cells by Controlling Reagent Partial Pressure in High Vacuum," Advanced Materials, 28(32): 7013-7019 (2016).

International Search Report and Written Opinion for International Application No. PCT/US2019/42134 dated Sep. 27, 2019.

Liu et al., "Efficient planar heterojunction perovskite solar cells by vapour deposition," Nature 501:395-398 (2013).

Ng et al., "Efficiency Enhancement by Defect Engineering in Perovskite Photovoltaic Cells Prepared Using Evaporated PbI2/CH3NH3I Multilayers," J Materials Chemistry, 3: 9223-9232 (2015).

Tavakoli et al., "Fabrication of Efficient Planar Perovskite Solar Cells Using a One-Step Chemical Vapor Deposition Method," Sci Rep, 5(14083):1-9 (2015).

Yang et al., "Alternating Precursor Layer Deposition for Highly Stable Perovskite Films Towards Efficient Solar Cells Using Vacuum Deposition," J Materials Chem, 3: 9401-9405 (2015).

Hoerantner et al., "High-Speed Vapor Transport Deposition of Perovskite Thin Films," ACS Applied Materials & Interfaces, 11: 32928-32936 (2019).

Extended European Search Report dated Mar. 21, 2022 in connection with European patent application No. 19837130.4.

* cited by examiner

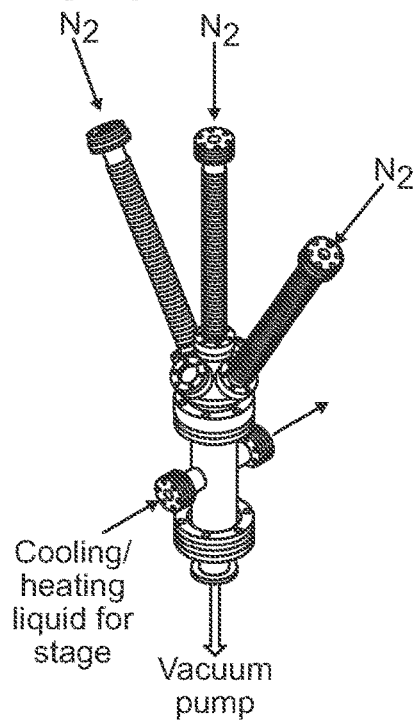
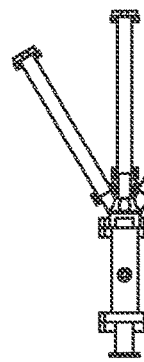
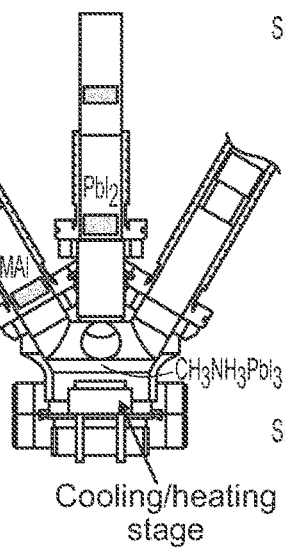
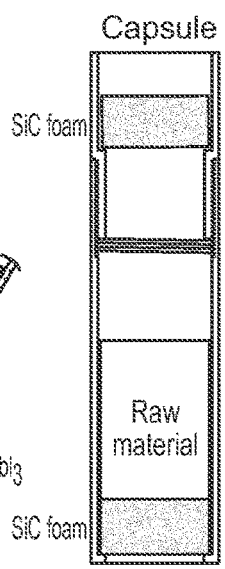
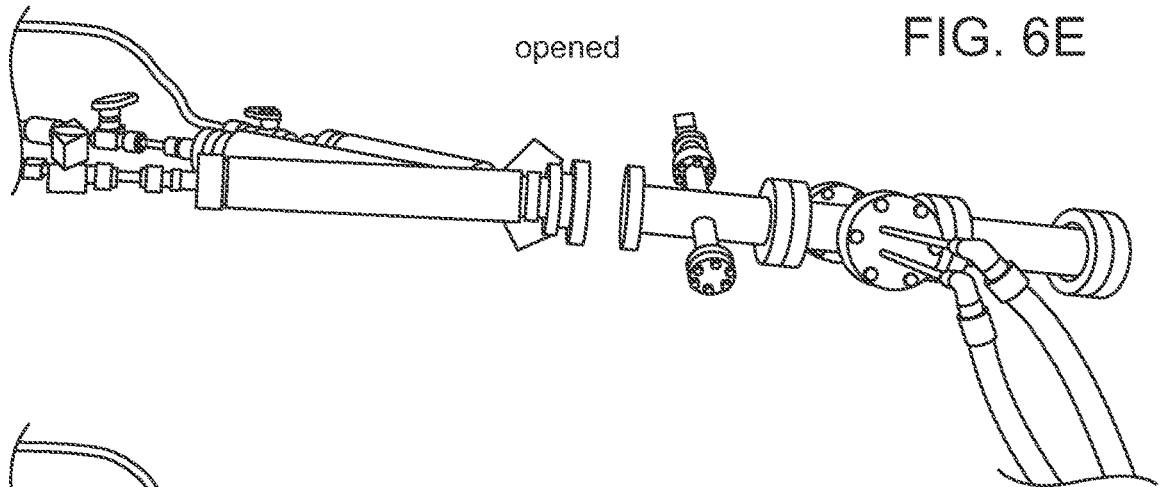
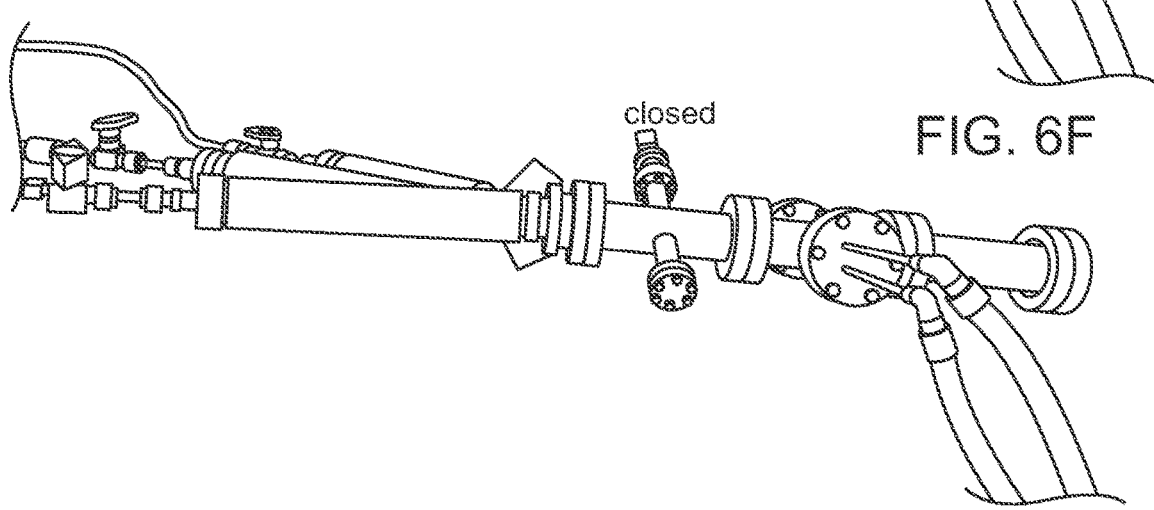

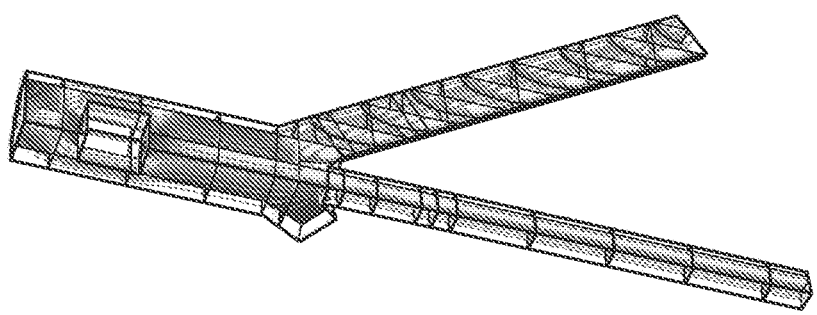
FIG. 9A
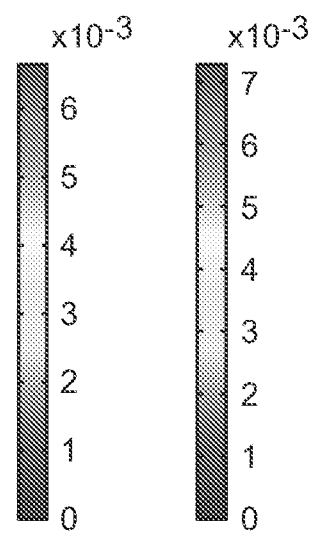
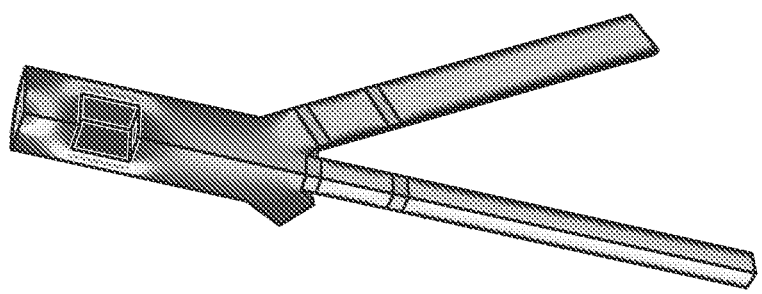
FIG. 9B
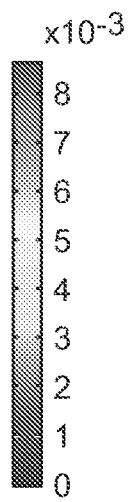

Very small grain size!

ALTERNATING MULTI-SOURCE VAPOR TRANSPORT DEPOSITION

RELATED APPLICATIONS

This application claims the benefit of priority to U.S. Provisional Application No. 62/699,824, filed Jul. 18, 2018, the contents of which is incorporated herein by reference.

BACKGROUND

The latest efficiency and stability data for hybrid metal-halide perovskite solar cells (close to 23% and longer than 1000 h) make them one of the most promising emerging energy technologies. Because most of the research is still being performed on small lab-based equipment, state-of-the-art perovskite solar cells still employ unscalable spin-coating methods. However, any solution process introduces major fabrication risks for a stacked perovskite solar cell, because the solvents needed for the top perovskite layer tend to dissolve many of the commonly used bottom layers. The inherent non-uniformity of solution coating often introduces macroscopic defects that can act as shunt pathways, non-active areas, or avenues for moisture and metal ingress, compromising device stability. Specifically, multi-junction devices, which represent a feasible pathway for future high-performance photovoltaics, suffer from such problems. Currently, all efficient perovskite-perovskite tandems utilize a thick (>100 nm) indium tin oxide (ITO) recombination layer on top of the first perovskite layer to protect it during subsequent steps. However, ITO is expensive, intolerant to imperfections, and parasitically absorbing. Standard solvents are often toxic, resulting in large amounts of hazardous solvent waste. Furthermore, solvent drying kinetics make it difficult to control independently film formation and crystallization to achieve the desired film quality, especially over large areas.

Conventional vapor transport deposition (VTD) systems rely on only one material vapor source or allow for simultaneous co-deposition from two sources. Organic-inorganic hybrid halide perovskite thin films for photovoltaic applications require a combination of multiple materials for high quality crystal growth. Typically, perovskite compounds for solar cell applications are made by a mixture of an organic halide, such as methylammonium iodide (MAI) or formamidinium iodide (FAI), where bromide or chloride are also possible halide substitutes, together with a metal halide, such as lead iodide (in which bromide or chloride are possible halide substitutes, and tin is a possible substitute for lead) to form a $ABX_3$ crystal structure. As the material compounds sublimate at different temperatures (the metal halide materials require higher temperatures than the organic materials), material vapors for deposition have large temperature differences. Combining colder material vapor with hotter material vapor can lead to deposition in unfavorable regions or to decomposition of materials, which both lead to a substantial reduction in material utilization. Alternatively, perovskite crystals can be grown by sequential deposition in which one material film is grown and then exposed to a second or third material vapor that diffuses and forms the desired crystal; however, the required inter-diffusion is a slow process and leads to reduced throughput.

Previous examples of vapor deposited perovskite films were prepared via dual-source thermal evaporation of $PbCl_2$ and MAI, or by sequential evaporation of $PbI_2$ and MAI. Similarly, close space sublimation can be used to achieve perovskite film growth. Additionally, a vapor assisted solution process has been developed in which $PbI_2$ is initially deposited by solution-based spin-coating and subsequently converted by the exposure of thermally sublimated MAI vapor. Further, chemical vapor deposition processes in tube furnaces were reported by converting previously solution or thermally evaporation deposited $PbI_2$ films with vapor transported MAI or FAI films. A similar result was reported by combined chemical vapor deposition of MAI and $PbI_2$ in the same vacuum tube. In the field of organic semiconducting materials, a process known as low pressure organic vapor phase deposition has been developed, in which organic films are deposited by carrying evaporated small molecules with a gas stream through a heated apparatus onto a substrate. In the similar organic vapor jet deposition process the organic vapor is transported with a carrier gas through a heated nozzle and directed onto a cooled substrate for film growth.

However, previous vapor-based approaches require extremely low operating pressures ($10^{-6}$ Torr). Expensive vacuum equipment and long pump-down times limit throughput, while low material utilization increases material cost per watt and chamber cleaning requirements. Since the evaporation rate varies exponentially with and can only be controlled using the source temperature, precise optimization of multiple co-deposited precursors is difficult, and high deposition rates are limited by material decomposition.

There exists a need for high throughput, reliable methods of forming perovskite films.

SUMMARY

In certain embodiments, the invention relates to a method of making a perovskite film, comprising the steps of:
(a) heating a metal halide in a first source tube at a first temperature from about 350° C. to about 480° C. at a first pressure from about $1\times10^{-4}$ Torr to about $1\times10^2$ Torr, thereby producing a sublimated metal halide;
(b) flowing a first carrier gas from a first inlet through the first source tube and exposing a substrate to the sublimated metal halide and the first carrier gas at a second pressure from about $1\times10^{-4}$ Torr to about $1\times10^2$ Torr, thereby forming a metal halide-coated substrate;
(c) heating an organic halide in a second source tube at a second temperature from about 100° C. to about 250° C. at a third pressure from about $1\times10^{-4}$ Torr to about $1\times10^2$ Torr, thereby producing a sublimated organic halide; and
(d) flowing a second carrier gas from a second inlet through the second source tube and exposing the metal halide-coated substrate to the sublimated organic halide and a second carrier gas at the second pressure from about $1\times10^{-4}$ Torr to about $1\times10^2$ Torr, thereby forming the perovskite film.

In certain embodiments, the invention relates to a method of making a perovskite film, comprising the steps of:
(a) heating an organic halide in a second source tube at a second temperature from about 100° C. to about 250° C. at a third pressure from about $1\times10^{-4}$ Torr to about $1\times10^2$ Torr, thereby producing a sublimated organic halide;
(b) flowing a second carrier gas from a second inlet through the second source tube and exposing a substrate to the sublimated organic halide and the second carrier gas at the second pressure from about $1\times10^{-4}$ Torr to about $1\times10^2$ Torr, thereby forming an organic halide-coated substrate;
(c) heating a metal halide in a first source tube at a first temperature from about 350° C. to about 480° C. at a first pressure from about $1\times10^{-4}$ Torr to about $1\times10^2$ Torr, thereby producing a sublimated metal halide; and
(d) flowing a first carrier gas from a first inlet through the first source tube and exposing the organic halide-coated substrate to the sublimated metal halide and the first carrier gas at a second pressure from about $1\times10^{-4}$ Torr to about $1\times10^{2}$ Torr, thereby forming the perovskite film.

In certain embodiments, the invention relates to a method of making a perovskite film, comprising the steps of:

heating a metal halide in a first source tube at a first temperature from about 350° C. to about 480° C. at a first pressure from about $1\times10^{-4}$ Torr to about $1\times10^{2}$ Torr, thereby producing a sublimated metal halide;

heating an organic halide in a second source tube at a second temperature from about 100° C. to about 250° C. at a third pressure from about $1\times10^{-4}$ Torr to about $1\times10^{2}$ Torr, thereby producing a sublimated organic halide; and flowing a first carrier gas from a first inlet through the first source tube and flowing a second carrier gas from a second inlet through the second source tube exposing a substrate to the sublimated metal halide and the first carrier gas and the sublimated organic halide and the second carrier gas at a second pressure from about $1\times10^{-4}$ Torr to about $1\times10^{2}$ Torr, thereby forming the perovskite film.

In certain embodiments, the invention relates to a perovskite film formed by any of the methods described herein.

In certain embodiments, the invention relates to a semiconductor device, such as a solar cell, comprising any of the perovskite films described herein.

In certain embodiments, the invention relates to a source tube comprising a carrier gas inlet, a metal halide or an organic halide disposed between a first filter and a second filter, and a gas outlet, wherein the first filter and the second filter are substantially permeable to the carrier gas comprising sublimated metal halide or sublimated organic halide.

BRIEF DESCRIPTION OF THE DRAWINGS

FIG. 6A is a 3D drawing of a vapor transport deposition tool with three vaporization sources.

FIGS. 6B-6F are a series of 3D drawings showing the cross-section of a vapor transport deposition tool with three vaporization source tubes and a temperature controlled substrate stage as well as the material capsules surrounded by two porous SiC foam disks.

FIG. 9A is a representation of the simulated steady state velocity in a source tube.

FIG. 9B is a representation of the simulated steady state pressure in a source tube.

FIG. 11I is a SEM image of a $PbI_2$ and MAPI perovskite film deposited sequentially with VTD.

DETAILED DESCRIPTION

Overview

In certain embodiments, the invention relates to devices and methods for material vapor transport deposition (VTD). In certain embodiments, multiple materials are deposited, for example, to form perovskite films.

In certain embodiments, the invention relates to a multiple (i.e., two or more) source VTD mechanism or device for multi (i.e., two or more) component metal-halide hybrid perovskite crystal film growth. In certain embodiments, the device includes a mechanically or digitally controlled alternating shutter system for the material vapor sources for fast sequential VTD of perovskite materials. Perovskite film growth is accelerated by quick alternating growth and inter-diffusion of multiple materials by short alternating deposition cycles.

In certain embodiments, the invention relates to a method for depositing perovskite thin films with high throughput. In certain embodiments, the method does not comprise the use of solvent. In certain embodiments, the method uses pressures no lower than $10^{-3}$ Torr; these pressures are achievable with inexpensive pumping and chamber equipment. This capability substantially reduces costs compared to thermal evaporation. Further, at these relatively high pressures precursor molecules are distributed randomly in the carrier gas. In certain embodiments, the method utilizes controlled flow of carrier gases.

In certain embodiments, because VTD decouples evaporation and condensation, the methods described herein result in orders-of-magnitude higher deposition rates than previous methods, without decomposing the materials.

In certain embodiments, accurate compositional control enables precise stoichiometric co-deposition of multiple compounds, which, in turn, permits the fabrication of multi-component perovskite films with minimal defects—a key requirement for efficient and stable devices. Crystallization conditions can be fine-tuned by varying the substrate temperature and deposition pressure, allowing control of the film morphology and defect densities. In certain embodiments, the films deposited by the methods described herein are highly uniform. In certain embodiments, the films deposited by the methods described herein have substantially 100% material utilization, such as about 95%, about 96%, about 97%, about 98%, or about 99% utilization.

In certain embodiments, the invention relates to a device comprising a co-deposition channel or a mixing chamber.

Figure 1:
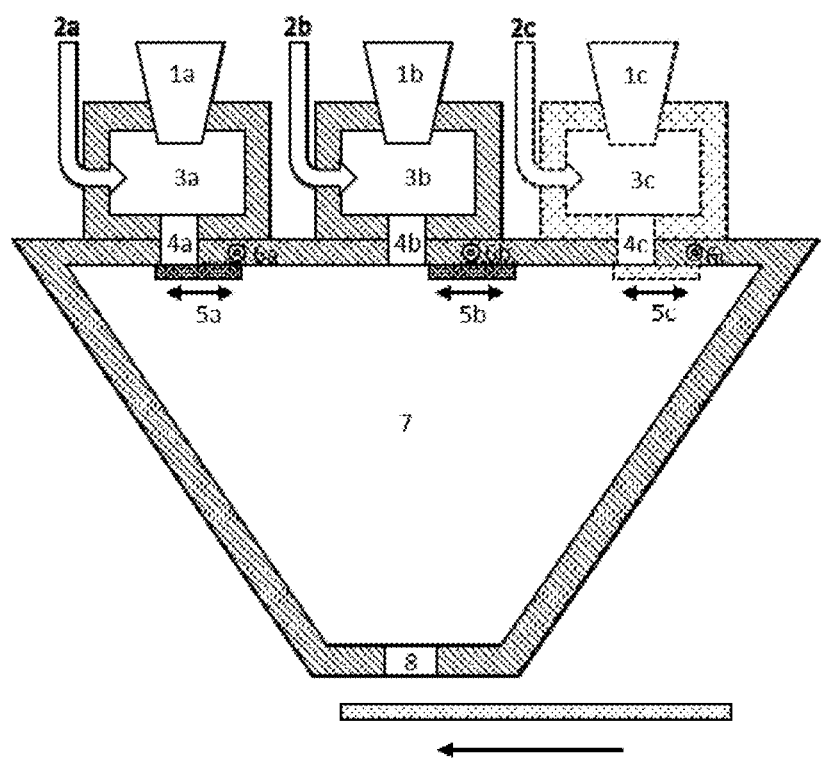
FIG. 1 is a cross sectional view of an exemplary multi-source VTD system with individually controlled shutters.

Referring now to the drawings in more detail, in FIG. 1 there are shown multiple sublimation chambers 3a, 3b, 3c having material feeders 1a, 1b, 1c and carrier gas inlets 2a, 2b, 2c. Each of the sublimation chambers may be physically attached to a vapor-mixing chamber 7 and allows vapor flow through vapor openings 4a, 4b, 4c. Shutters 5a, 5b, 5c may be digitally controlled and translated by shutter control system 6a, 6b, 6c. The mixing chamber may have a main opening 8 at the bottom. A substrate 9 may be placed underneath the main opening.

In more detail, and still referring to FIG. 1, sublimation chambers may be heated to the correct temperature so that the material sublimates and the carrier gas inlets and material feeders are optimized for the correct material vaporization rate and pressure. The shutters may be digitally controlled by the shutter control systems and are mechanically moved automatically to lead to the correct material vapor mixing in the mixing chamber and the controlled deposition of the material on the substrate by changing the shutter interval and speed. Fast alternating deposition of the vaporized materials is possible. The substrate may be moved horizontally and can be continuous and flexible in a roll-to-roll system. The distance between the substrate and the main opening can be changed. All components can be constructed with sufficient width to make the system a linear source deposition system.

The construction details as shown in FIG. 1 are that the sublimation chambers and the mixing chamber may be made of stainless steel or any other sufficiently pressure and heat resistant material such as other metals, quartz glass and the like. Further, the various components of the shutter may be made of heat resistant materials and the actuators of the shutter control system may be designed for fast response. The sublimation chambers and the mixing chamber may be surrounded by heating units and well thermally insulated around them.

Figure 2:
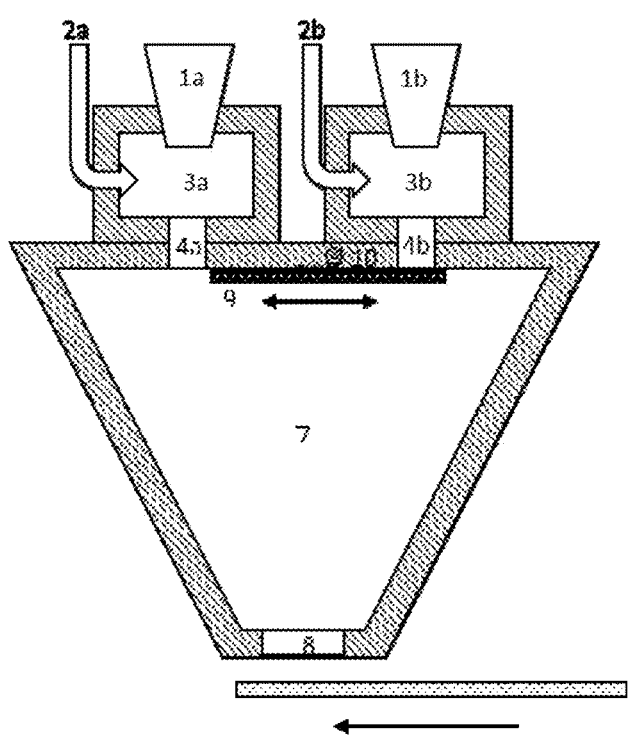
FIG. 2 is a cross sectional view of the multi-source VTD system of FIG. 1 with mechanically combined shutters.

Referring now to FIG. 2, as in FIG. 1 there are shown multiple sublimation chambers 3a, 3b having material feeders 1a, 1b and carrier gas inlets 2a, 2b. Each of the sublimation chambers may be physically attached to a vapor mixing chamber 7 and may allow vapor flow through vapor openings 4a, 4b. A shutter 10 may be digitally controlled and translated by shutter control system 11. The mixing chamber may have a main opening 8 at the bottom. A substrate 9 may be placed underneath the main opening.

In more detail, as shown in FIG. 2, the shutter may be digitally controlled by the shutter control system and may be moved automatically to allow vapor transport from the sublimation chamber to the mixing chamber while closing the transport for another sublimation chamber to the mixing chamber. Fast alternating deposition of the vaporized materials is possible. The substrate may be moved horizontally and can be continuous and flexible in a roll-to-roll system. The distance between the substrate and the main opening can be changed. All components can be constructed with sufficient depth to make the system a linear source deposition system.

The construction details of the invention as shown in FIG. 2 are that the shutter components may be made of heat resistant materials and the actuators of the shutter control system may be designed for fast response. Further, the shutter may be designed with different geometries to create the desired deposition interval.

Figure 3:
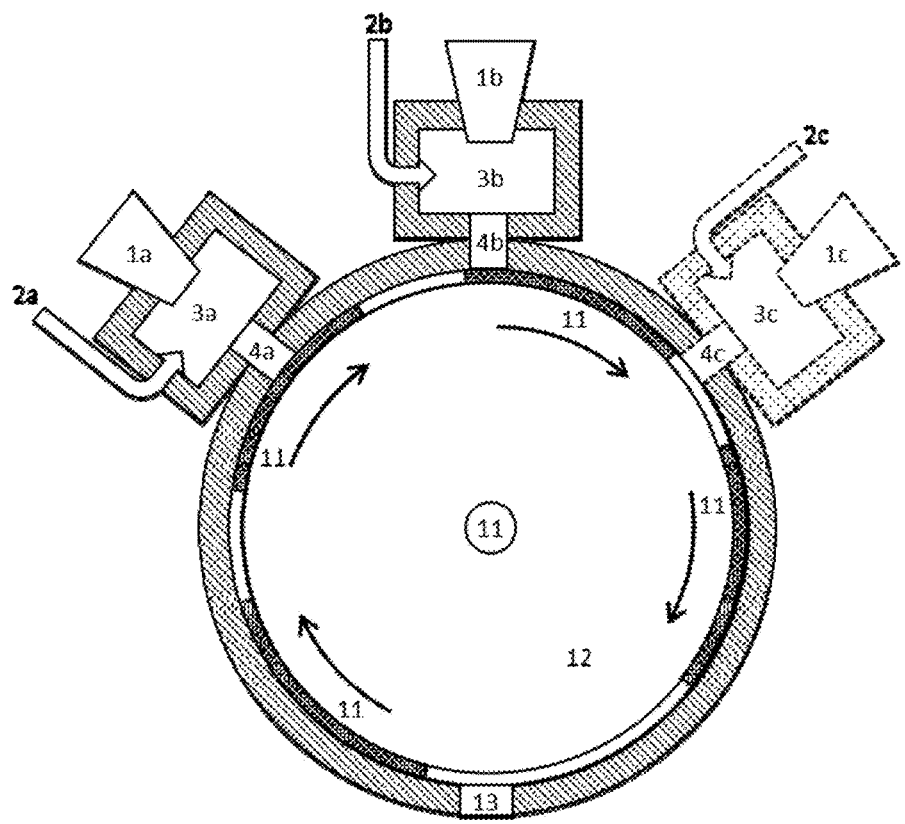
FIG. 3 is a cross sectional view of a multi-source VTD system with mechanically combined circular shutter system.

Referring now to FIG. 3, as in FIG. 1 there are shown multiple sublimation chambers 3a, 3b, 3c having material feeders 1a, 1b, 1c and carrier gas inlets 2a, 2b, 3c. Each of the sublimation chambers may be physically attached to a cylindrical vapor mixing chamber 13 and allows vapor flow through vapor openings 4a, 4b, 4c. A rotational shutter cylinder 12 may be digitally controlled and rotated. The mixing chamber may have a main opening 14 at the bottom. A substrate 9 may be placed underneath the main opening.

In more detail, and still referring to FIG. 3, the shutter cylinder may have openings that are located in positions so that ideal deposition sequence can be achieved by rotation of the shutter cylinder in one direction with controlled speed. Fast alternating deposition of the vaporized materials is possible. The substrate may be moved horizontally and can be continuous and flexible in a roll-to-roll system. The distance between the substrate and the main opening can be changed. All components can be constructed with sufficient depth to make the system a linear source deposition system.

The construction details of FIG. 3 are that the shutter may be made of heat resistant materials.

Figure 4:
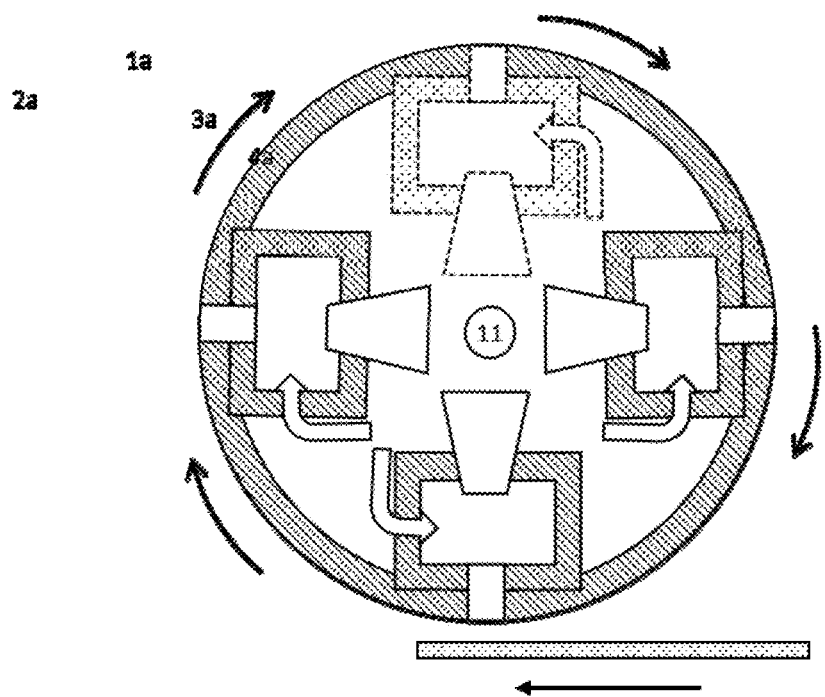
FIG. 4 is a cross sectional view of a rotating multi-source VTD system with stationary slit.

Referring now to FIG. 4, as in FIG. 1 there are shown multiple sublimation chambers 3a, 3b, 3c having material feeders 1a, 1b, 1c and carrier gas inlets 2a, 2b, 3c. Each of the sublimation chambers may be physically attached to a rotating cylinder 15 and may allow vapor flow through vapor openings 4a, 4b, 4c. The rotating cylinder may be inside an enclosing cylinder 16, which may have one main opening 17. A substrate 9 may be placed underneath the main opening.

In more detail, and still referring to FIG. 4, the rotating cylinder may rotate inside the enclosing cylinder in one direction with controlled speed. Fast alternating deposition of the vaporized materials may be possible. The substrate may be moved horizontally and can be continuous and flexible in a roll-to-roll system. The distance between the substrate and the main opening can be changed. All components can be constructed with sufficient depth to make the system a linear source deposition system.

The construction details of FIG. 4 are that the transport gas inlets and material feeders may be with rotational joints to avoid twisting of supply lines. The rotational cylinder may be heated with heating elements from the inside. The enclosing cylinder may be thermally insulated.

Figure 5:
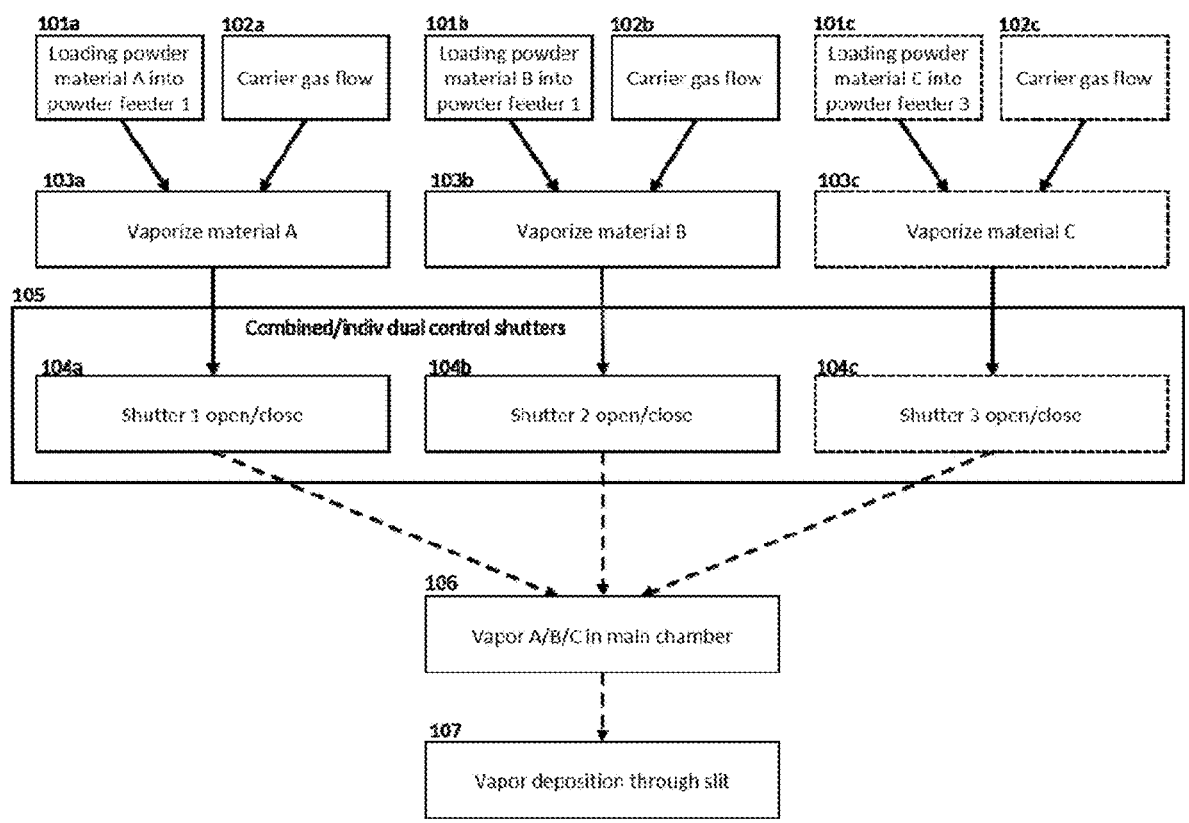
FIG. 5 is a flow chart of a multi-source VTD method with alternating shutters.
Figure 7:
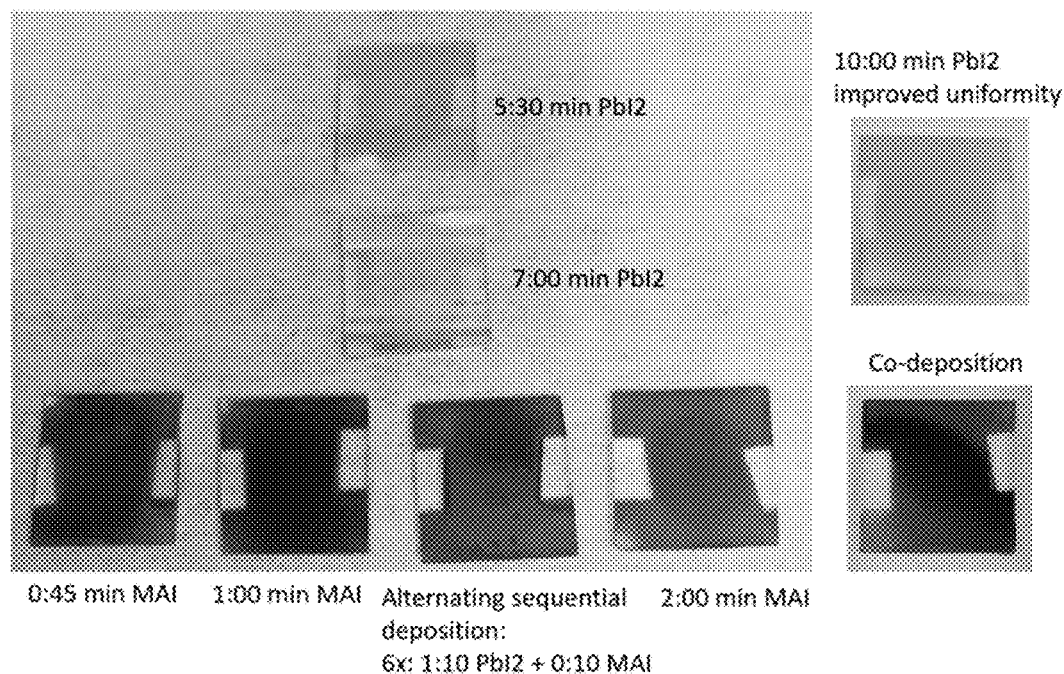
FIG. 7 is a series of photographs of $PbI_2$ and MAPI films that were made via various procedures with the vapor transport deposition tool.
Figure 8:
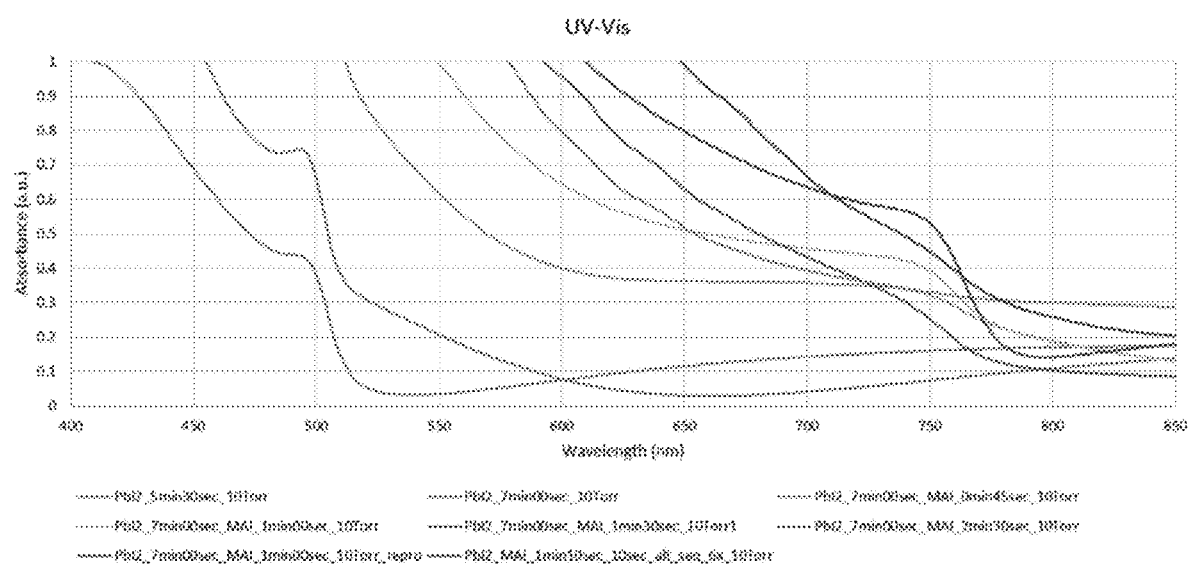
FIG. 8 is a plot of series of UV-Vis absorbance measurements of $PbI_2$ and MAPI films that were made via various procedures with the vapor transport deposition tool.
Figure 10:
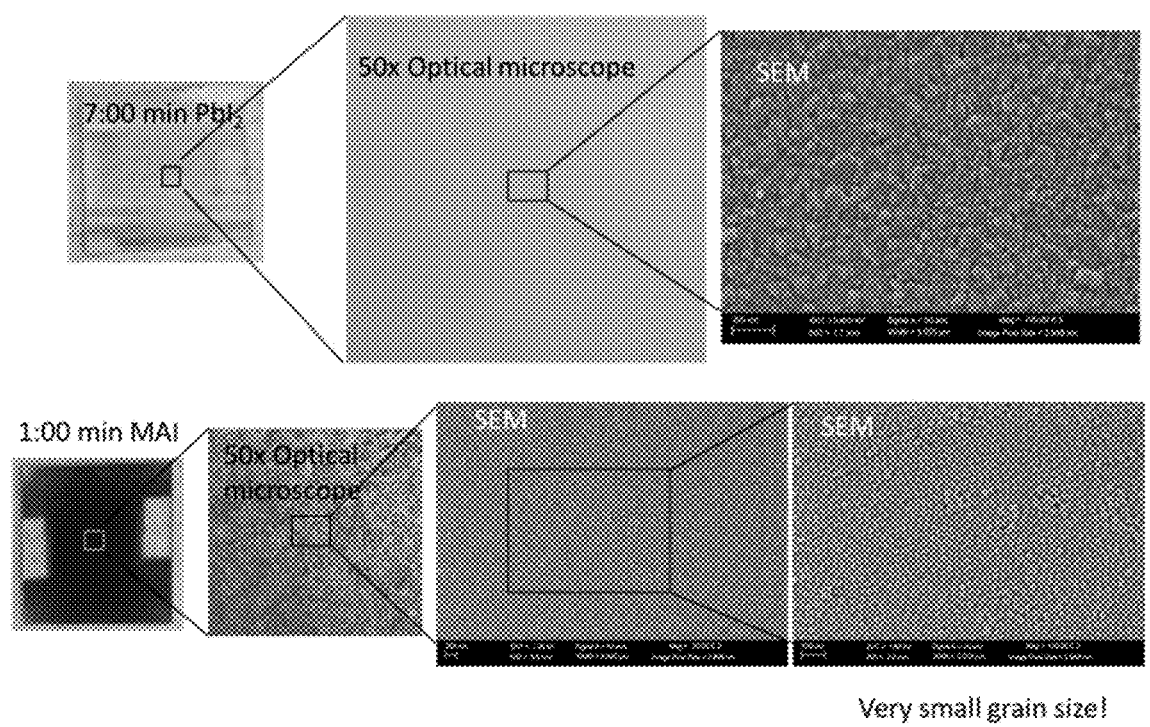
FIG. 10 is a series of images containing photographs, optical microscopy photographs and scanning electron microscopy images of $PbI_2$ and MAPI films.

Referring now to FIG. 5, there are shown multiple steps of material deposition. Steps 101a, 101b, 101c describe the controlled loading of material powder into material feeders simultaneously to steps 102a, 102b, 102c in which carrier gas flow occurs through transport gas inlets. Within sublimation chambers the steps 103a, 103b, 103c take place to vaporize the respective materials. At steps 104a, 104b, 104c the shutters are opened and closed individually or combined as a step 105. At step 106, depending on the shutter design and the control algorithm, vapors can mix or be transported without mixing. At step 107 the vapor is deposited onto the moving substrate through the main opening.

In certain embodiments, the methods described herein result in the timely controlled sequential deposition of material vapor. The alternating sequential deposition may be faster than the two-step sequential deposition as material vapor diffusion and conversion through thick films is not required. In certain embodiments, the methods result in more uniform films than combined deposition because high temperature degradation due to different sublimation temperatures of materials can be avoided.

Exemplary Methods, Perovskite Films, Semiconductor Devices, and Source Tubes

In certain embodiments, the invention relates to a method of making a perovskite film, comprising the steps of:
(a) heating a metal halide in a first source tube at a first temperature from about 350° C. to about 480° C. at a first pressure from about $1\times10^{-4}$ Torr to about $1\times10^{2}$ Torr, thereby producing a sublimated metal halide;
(b) flowing a first carrier gas from a first inlet through the first source tube and exposing a substrate to the sublimated metal halide and the first carrier gas at a second pressure from about $1\times10^{-4}$ Torr to about $1\times10^{2}$ Torr, thereby forming a metal halide-coated substrate;
(c) heating an organic halide in a second source tube at a second temperature from about 100° C. to about 250° C. at a third pressure from about $1\times10^{-4}$ Torr to about $1\times10^{2}$ Torr, thereby producing a sublimated organic halide; and
(d) flowing a second carrier gas from a second inlet through the second source tube and exposing the metal halide-coated substrate to the sublimated organic halide and a second carrier gas at the second pressure from about $1\times10^{-4}$ Torr to about $1\times10^{2}$ Torr, thereby forming the perovskite film.

In certain embodiments, the invention relates to a method of making a perovskite film, comprising the steps of:
(a) heating an organic halide in a second source tube at a second temperature from about 100° C. to about 250° C. at a third pressure from about $1\times10^{-4}$ Torr to about $1\times10^{2}$ Torr, thereby producing a sublimated organic halide;
(b) flowing a second carrier gas from a second inlet through the second source tube and exposing a substrate to the sublimated organic halide and the second carrier gas at the second pressure from about $1\times10^{-4}$ Torr to about $1\times10^{2}$ Torr, thereby forming an organic halide-coated substrate;
(c) heating a metal halide in a first source tube at a first temperature from about 350° C. to about 480° C. at a first pressure from about $1\times10^{-4}$ Torr to about $1\times10^{2}$ Torr, thereby producing a sublimated metal halide; and
(d) flowing a first carrier gas from a first inlet through the first source tube and exposing the organic halide-coated substrate to the sublimated metal halide and the first carrier gas at a second pressure from about $1\times10^{-4}$ Torr to about $1\times10^{2}$ Torr, thereby forming the perovskite film.

In certain embodiments, the invention relates to any of the methods described herein, wherein the metal halide and the organic halide are deposited sequentially on the substrate. In certain embodiments, the invention relates to any of the methods described herein, wherein the metal halide and the organic halide are deposited sequentially on the substrate in an alternating fashion.

In certain embodiments, the invention relates to a method of making a perovskite film, comprising the steps of:
heating a metal halide in a first source tube at a first temperature from about 350° C. to about 480° C. at a first pressure from about $1\times10^{-4}$ Torr to about $1\times10^{2}$ Torr, thereby producing a sublimated metal halide;
heating an organic halide in a second source tube at a second temperature from about 100° C. to about 250° C. at a third pressure from about $1\times10^{-4}$ Torr to about $1\times10^{2}$ Torr, thereby producing a sublimated organic halide; and
flowing a first carrier gas from a first inlet through the first source tube and flowing a second carrier gas from a second inlet through the second source tube exposing a substrate to the sublimated metal halide and the first carrier gas and the sublimated organic halide and the second carrier gas at a second pressure from about $1\times10^{-4}$ Torr to about $1\times10^{2}$ Torr, thereby forming the perovskite film.

In certain embodiments, the invention relates to any of the methods described herein, wherein the metal halide and the organic halide are deposited on the substrate substantially simultaneously.

In certain embodiments, the invention relates to any of the methods described herein, wherein the perovskite film is from about 300 nm to about 1.5 m thick. In certain embodiments, the invention relates to any of the methods described herein, wherein the perovskite film is from about 300 nm to about 800 nm thick.

In certain embodiments, the invention relates to any of the methods described herein, wherein the substrate is a glass substrate.

In certain embodiments, the invention relates to any of the methods described herein, wherein the substrate comprises polyethylene naphthalate.

In certain embodiments, the invention relates to any of the methods described herein, wherein the substrate comprises polyethylene terephthalate.

In certain embodiments, the invention relates to any of the methods described herein, wherein the substrate is substantially planar.

In certain embodiments, the invention relates to any of the methods described herein, wherein the substrate comprises a fluorinated tin oxide coating, an indium tin oxide coating, a graphene coating, or a coating comprising silver, for example, silver nanowires. In certain embodiments, the invention relates to any of the methods described herein, wherein the substrate comprises a fluorinated tin oxide coating.

In certain embodiments, the invention relates to any of the methods described herein, further comprising the step of removing a portion of the fluorinated tin oxide coating from the substrate. In certain embodiments, the invention relates to any of the methods described herein, further comprising the step of removing a portion of the fluorinated tin oxide coating from the substrate before the substrate is exposed to the metal halide or the organic halide. In certain embodiments, the invention relates to any of the methods described herein, wherein the portion of the fluorinated tin oxide coating is removed by etching. In certain embodiments, the invention relates to any of the methods described herein, wherein the portion of the fluorinated tin oxide coating is removed by etching with zinc powder and an aqueous acid. In certain embodiments, the invention relates to any of the methods described herein, wherein the portion of the fluorinated tin oxide coating is removed by etching in a striped pattern.

In certain embodiments, the invention relates to any of the methods described herein, further comprising exposing the substrate to a metal oxide, thereby forming a substrate coated with an n-type layer. In certain embodiments, the invention relates to any of the methods described herein, further comprising exposing the substrate to a metal oxide, thereby forming a substrate coated with an n-type layer before the substrate is exposed to the metal halide or the organic halide. In certain embodiments, the invention relates to any of the methods described herein, wherein the substrate coated with the n-type layer is formed by spin coating a metal oxide solution onto the substrate. In certain embodiments, the invention relates to any of the methods described herein, wherein the metal oxide is $TiO_2$ or $SnO_2$.

In certain embodiments, the invention relates to any of the methods described herein, further comprising exposing the substrate to a metal oxide, thereby forming a substrate coated with an n-type layer. In certain embodiments, the invention relates to any of the methods described herein, further comprising exposing the substrate to a metal oxide, thereby forming a substrate coated with an n-type layer before the substrate is exposed to the metal halide or the organic halide.

In certain embodiments, the invention relates to any of the methods described herein, further comprising etching the substrate with $O_2$ plasma. In certain embodiments, the invention relates to any of the methods described herein, further comprising, before step (a), etching the substrate with $O_2$ plasma.

In certain embodiments, the invention relates to any of the methods described herein, wherein the metal halide is $PbI_2$, $PbBr_2$, $PbCl_2$, $SnI_2$, $SnBr_2$, $SnCl_2$, CsI, CsBr, or CsCl. In certain embodiments, the invention relates to any of the methods described herein, wherein the metal halide is $PbI_2$.

In certain embodiments, the invention relates to any of the methods described herein, wherein the organic halide is methylammonium iodide (MAI), methylammonium bromide, methylammonium chloride, formamidinium iodide (FAI), formamidinium bromide, or formamidinium chloride. In certain embodiments, the invention relates to any of the methods described herein, wherein the organic halide is methylammonium iodide.

In certain embodiments, the invention relates to any of the methods described herein, wherein the first carrier gas is $N_2$ or Ar.

In certain embodiments, the invention relates to any of the methods described herein, wherein the second carrier gas is $N_2$ or Ar.

In certain embodiments, the invention relates to any of the methods described herein, wherein the substrate is reversibly fastened to a temperature-controlled stage.

In certain embodiments, the invention relates to any of the methods described herein, wherein the temperature of the temperature-controlled stage is from about 60° C. to about 150° C.

In certain embodiments, the invention relates to any of the methods described herein, wherein the first pressure from about $1 \times 10^{-4}$ Torr to about 10 Torr.

In certain embodiments, the invention relates to any of the methods described herein, wherein the second pressure from about $1 \times 10^{-4}$ Torr to about 10 Torr.

In certain embodiments, the invention relates to any of the methods described herein, wherein the third pressure from about $1 \times 10^{-4}$ Torr to about 10 Torr.

In certain embodiments, the invention relates to any of the methods described herein, wherein the first pressure, the second pressure, and the third pressure are from about $1 \times 10^{-4}$ Torr to about 10 Torr.

In certain embodiments, the invention relates to any of the methods described herein, wherein the first pressure is about 10 Torr.

In certain embodiments, the invention relates to any of the methods described herein, wherein the second pressure is about 10 Torr.

In certain embodiments, the invention relates to any of the methods described herein, wherein the substrate is exposed to the sublimated metal halide and the first carrier gas for a first period of time. In certain embodiments, the invention relates to any of the methods described herein, wherein the first period of time is from about 1 millisecond to about 5 minutes. In certain embodiments, the invention relates to any of the methods described herein, wherein the first period of time is about 3 minutes.

In certain embodiments, the invention relates to any of the methods described herein, wherein the metal halide coating is from about 50 nm to about 700 nm.

In certain embodiments, the invention relates to any of the methods described herein, wherein the metal halide-coated substrate is exposed to the sublimated organic halide and the second carrier gas for a second period of time. In certain embodiments, the invention relates to any of the methods described herein, wherein the second period of time is from about 1 millisecond to about 3 min. In certain embodiments, the invention relates to any of the methods described herein, wherein the second period of time is about 90 seconds.

In certain embodiments, the invention relates to any of the methods described herein, further comprising repeating steps (b) and (d) up to 50 times. In certain embodiments, the invention relates to any of the methods described herein, wherein a second metal halide or a second organic halide are deposited.

In certain embodiments, the invention relates to any of the methods described herein, wherein the first source tube and the second source tube are oriented horizontally.

In certain embodiments, the invention relates to any of the methods described herein, wherein the surface of the substrate is oriented vertically.

In certain embodiments, the invention relates to a perovskite film formed by any of the methods described herein.

In certain embodiments, the invention relates to a semiconductor device, such as a solar cell, comprising any of the perovskite films described herein.

In certain embodiments, the invention relates to a source tube comprising a carrier gas inlet, a metal halide or an organic halide disposed between a first filter and a second filter, and a gas outlet, wherein the first filter and the second filter are substantially permeable to the carrier gas comprising sublimated metal halide or sublimated organic halide. In certain embodiments, the invention relates to any of the source tubes described herein, wherein the first filter or the second filter comprises SiC. In certain embodiments, the invention relates to any of the source tubes described herein, wherein the first filter and the second filter comprise SiC.

In certain embodiments, the invention relates to a deposition device according to any of the descriptions herein. In certain embodiments, the invention relates to any of the deposition devices described herein, wherein the deposition device comprises at least two source tubes. In certain embodiments, the invention relates to any of the deposition devices described herein, wherein the deposition device comprises 2, 3, 4, 5, or 6 source tubes.

Definitions

As used herein, "vapor transport deposition" (VTD) is a process that uses a transport carrier gas to carry sublimated material vapors onto a desired substrate and in which a chemical reaction of the vapors is not required for the final film deposition.

The term "photoactive", as used herein, refers to a region, layer or material that is capable of responding to light photoelectrically. A photoactive region, layer or material is therefore capable of absorbing the energy carried by photons in light that then results in the generation of electricity (e.g., by generating either electron-hole pairs or excitons).

The term "conform", as used herein, refers to an object that is substantially the same in form or shape as another object. A "conformal layer", as used herein, therefore refers to a layer of material that conforms to the contours of the surface on which the layer is formed. In other words, the morphology of the layer is such that the thickness of the layer is approximately constant across the majority of the interface between the layer and the surface on which the layer is formed.

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$ type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will often be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e., a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is $[2-(1-cyclohexenyl)ethylammonium]_2PbBr_4$. 2D layered perovskites tend to have high exciton binding energies, which favors the generation of bound electron-hole pairs (excitons), rather than free charge carriers, under photoexcitation. The bound electron-hole pairs may not be sufficiently mobile to reach the p-type or n-type contact where they can then transfer (ionize) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e., a perovskite which has a three-dimensional crystal structure. This is particularly preferable when the optoelectronic device is a photovoltaic device.

The perovskite material employed in the present invention is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e., a material which is capable of performing both photogeneration and charge transportation.

The term "mixed-anion", as used herein, refers to a compound comprising at least two different anions. The term "halide" refers to an anion of an element selected from Group 17 of the Periodic Table of the Elements, i.e., of a halogen. Typically, halide anion refers to a fluoride anion, a chloride anion, a bromide anion, an iodide anion or an astatide anion.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor.

The term "dielectric", as used herein, refers to material that is an electrical insulator or a very poor conductor of electric current. The term dielectric therefore excludes semiconducting materials such as titania. The term dielectric, as used herein, typically refers to materials having a band gap of equal to or greater than 4.0 eV (The band gap of titania is about 3.2 eV.)

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron transporting materials. The term "n-type region", as used herein, therefore refers to a region of one or more electron transporting (i.e., n-type) materials. Similarly, the term "n-type layer" refers to a layer of an electron-transporting (i.e., an n-type) material. An electron-transporting (i.e., an n-type) material could be a single electron-transporting compound or elemental material, or a mixture of two or more electron-transporting compounds or elemental materials. An electron-transporting compound or elemental material may be undoped or doped with one or more dopant elements.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole transporting materials. The term "p-type region", as used herein, therefore refers to a region of one or more hole transporting (i.e., p-type) materials. Similarly, the term "p-type layer" refers to a layer of a hole-transporting (i.e., a p-type) material. A hole-transporting (i.e., a p-type) material could be a single hole-transporting compound or elemental material, or a mixture of two or more hole-transporting compounds or elemental materials. A hole-transporting compound or elemental material may be undoped or doped with one or more dopant elements.

The term "band gap", as used herein, refers to the energy difference between the top of the valence band and the bottom of the conduction band in a material. The skilled person may readily measure the band gap of a material without undue experimentation.

The term "layer", as used herein, refers to any structure that is substantially laminar in form (for instance extending substantially in two perpendicular directions, but limited in its extension in the third perpendicular direction). A layer may have a thickness that varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the body of the material where there is no material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e., the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (Rouquerol, J. et al, (1994) Recommendations for the characterization of porous solids (Technical Report). Pure and Applied Chemistry, 66(8)). The following distinctions and definitions were adopted in previous IUPAC documents (J. Haber. (1991) Manual on catalyst characterization (Recommendations 1991). Pure and Applied Chemistry.): micropores have widths (i.e., pore sizes) smaller than 2 nm; Mesopores have widths (i.e., pore sizes) of from 2 nm to 50 nm; and Macropores have widths (i.e., pore sizes) of greater than 50 nm. In addition, nanopores may be considered to have widths (i.e., pore sizes) of less than 1 nm.

Pores in a material may include "closed" pores as well as open pores. A closed pore is a pore in a material which is a non-connected cavity, i.e., a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. Thus, a material without open porosity typically has no macropores and no mesopores. A material without open porosity may comprise micropores and nanopores, however. Such micropores and nanopores are typically too small to have a negative effect on a material for which low porosity is desired.

In addition, polycrystalline materials are solids that are composed of a number of separate crystallites or grains, with grain boundaries at the interface between any two crystallites or grains in the material. A polycrystalline material can therefore have both interparticle/interstitial porosity and intraparticle/internal porosity. The terms "interparticle porosity" and "interstitial porosity", as used herein, refer to pores between the crystallites or grains of the polycrystalline material (i.e., the grain boundaries), whilst the terms "intraparticle porosity" and "internal porosity", as used herein, refer to pores within the individual crystallites or grains of the polycrystalline material. In contrast, a single crystal or monocrystalline material is a solid in which the crystal lattice is continuous and unbroken throughout the volume of the material, such that there are no grain boundaries and no interparticle/interstitial porosity.

The term "compact layer", as used herein, refers to a layer without mesoporosity or macroporosity. A compact layer may sometimes have microporosity or nanoporosity.

The term "scaffold material", as used herein, therefore refers to a material that is capable of acting as a support for a further material. The term "porous scaffold material", as used herein, therefore refers to a material which is itself porous, and which is capable of acting as a support for a further material.

The term "transparent", as used herein, refers to material or object allows visible light to pass through almost undisturbed so that objects behind can be distinctly seen. The term "semi-transparent", as used herein, therefore refers to material or object which has a transmission (alternatively and equivalently referred to as a transmittance) to visible light intermediate between a transparent material or object and an opaque material or object. Typically, a transparent material will have an average transmission for visible light (generally light with a wavelength of from 370 to 740 nm) of around 100%, or from 90 to 100%. Typically, an opaque material will have an average transmission for visible light of around 0%, or from 0 to 5%. A semi-transparent material or object will typically have an average transmission for visible light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "electrode", as used herein, refers to a conductive material or object through which electric current enters or leaves an object, substance, or region. The term "negative electrode", as used herein, refers to an electrode through which electrons leave a material or object (i.e., an electron collecting electrode). A negative electrode is typically referred to as an "anode". The term "positive electrode", as used herein, refers to an electrode through which holes leave a material or object (i.e., a hole collecting electrode). A positive electrode is typically referred to as a "cathode". Within a photovoltaic device, electrons flow from the positive electrode/cathode to the negative electrode/anode, whilst holes flow from the negative electrode/anode to the positive electrode/cathode.

The term "front electrode", as used herein, refers to the electrode provided on that side or surface of a photovoltaic device that it is intended will be exposed to sun light. The front electrode is therefore typically required to be transparent or semi-transparent so as to allow light to pass through the electrode to the photoactive layers provided beneath the front electrode. The term "back electrode", as used herein, therefore refers to the electrode provided on that side or surface of a photovoltaic device that is opposite to the side or surface that it is intended will be exposed to sun light.

The term "charge transporter" refers to a region, layer or material through which a charge carrier (i.e., a particle carrying an electric charge), is free to move. In semiconductors, electrons act as mobile negative charge carriers and holes act as mobile positive charges. The term "electron transporter" therefore refers to a region, layer or material through which electrons can easily flow and that will typically reflect holes (a hole being the absence of an electron that is regarded as a mobile carrier of positive charge in a semiconductor). Conversely, the term "hole transporter" refers to a region, layer or material through which holes can easily flow and that will typically reflect electrons.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

The term "roughness", as used herein, refers to the texture of a surface or edge that is uneven or irregular (and therefore lacks smoothness or regularity). The roughness of a surface can be quantified by any measure of the deviations of the surface in a direction that is typically normal to the average surface. As a measure of roughness, the roughness average or mean roughness ($R_a$) is the arithmetical mean of the absolute values of all deviations from a straight line within a specified reference or sampling length of the surface profile. As an alternative measure of roughness, the root mean square roughness ($R_{rms}$ or $R_q$) is the root mean square of the values of all deviations from a straight line within a specified reference or sampling length of the surface profile.

EXEMPLIFICATION

The invention now being generally described, it will be more readily understood by reference to the following examples, which are included merely for purposes of illustration of certain aspects and embodiments of the invention, and are not intended to limit the invention.

Example 1—Alternating Multi-Source Vapor Transport Deposition Substrate Preparation The glass substrates were purchased from Pilkington Inc. with a coated fluorinated tin oxide (FTO) layer of 7 or 15 Ω/sq. FTO was partially removed from the substrate via etching with zinc powder and 2 M HCl to create non-conductive stripes for later needed counter-electrode fabrication. The etched substrates were rinsed in deionized (DI) water and cleaned rigorously by brushing Hellmanex solution with a toothbrush before rinsing again in a stream of DI water. $N_2$ was used to dry the substrates that were then subsequently rinsed in Acetone and 2-Propanol and then etched for 10 min in $O_2$ plasma.

Bottom n-Type or p-Type Layer Deposition

Spin-Coated $TiO_2$ n-Type Layer:

The n-type $TiO_2$ compact layer was formed by spin-coating a solution of 0.71 g titanium isopropoxide and 0.07 g of 2 M HCl in 8 mL of Ethanol with 2000 rpm for 45 seconds and then annealed at 500° C. for 45 minutes.

Spin-Coated and Chemical Bath Treated $SnO_2$ n-Type Layer:

The $SnO_2$ layer was prepared by following the method. 0.05 M $SnCl_4.5H_2O$ was dissolved over 30 min of stirring in 2-Propanol and then spin-coated in volumes of 200 µl onto the cleaned and etched glass/FTO substrates with 3000 rpm for 30 seconds and 200 rpm/s acceleration. The substrates were then dried for 10 min at 100° C. and 60 min at 180° C. In the meanwhile, a chemical bath was prepared by mixing 40 mL DI water with 500 mg of urea, 500 µL of HCl (37 wt %), 10 µl of 3-Mercaptopropionic acid and 108 mg of $SnCl_2.2H_2O$ (for a final concentration of 0.012 M). The cooled down, spin-coated substrates were then immersed into the chemical bath to be well covered by solution and a lid was placed onto the beaker to prevent evaporation. The bath was kept at 70° C. within an oven for 180 min and afterwards the samples were sonicated for 2 min in DI water. The substrates were dried under a stream of dry air and then put onto a hotplate at 180° C. for 60 min.

Perovskite Thin-Film Deposition

The perovskite thin-films were deposited with the custom-built tool pictured in FIGS. 6A-6F. The procedure started with the opening of the vacuum tight system and the loading of the source materials. In order to keep the system clean, and to support the reproducibility of the experiments, the material capsules (see FIGS. 6A-6F) including the metal parts and the SiC filter disks were cleaned thoroughly by immersion into dimethylsulfoxide (DMSO) and sonication for 5 minutes, and then immersing and rinsing in isopropanol (IPA), before drying with a stream of nitrogen, and placement onto a 150° C. hotplate for 10 minutes. After assembly of the capsules, roughly 1 g of lead iodide ($PbI_2$) powder was loaded into one capsule and ca. 1 g of methylammonium iodide (MAI) powder was loaded into a second capsule. The source tubes of the VTD tool were cleaned by wiping the inside with DMSO soaked cleanroom wipes that were pushed through the tube by a metal rod. The lead iodide capsule was then placed and pushed from the $N_2$ supply side into the middle source tube until it would not move further due to a tube narrowing at the very end. The MAI capsule was placed into the left source tube in the same way. The subsequent loading of the previously prepared substrate was performed by using caption tape, which covered only a small area on the side of the substrate, to fasten it to the temperature controlled metal stage. The tool was then closed to allow for a roughing vacuum. The vacuum pump was turned on and the system pressure reaches values close to $1 \times 10^{-3}$ Torr after a couple of minutes. The vacuum pump was kept clean by using a cold trap that needed to be refilled with liquid nitrogen before every use. To keep the pressure of the system constant, the side $N_2$ inlet valve was opened and the flow adjusted so that the chamber reached a pressure of 10 Torr. Then the circulation bath heater was turned on to 100° C. and after a couple of minutes the temperature controlled substrate stage reached a measured temperature of ca. 75° C. Subsequently the middle $PbI_2$ source tube was heated to 450° C., which was controlled by adjusting the power source of the resistive heating band and probing the temperature at the outside of the tube. Once the target temperature was reached we waited 5 minutes for uniform, steady state temperature distribution and sublimation of the material before we turned on the $N_2$ source flow and simultaneously turned off the side inlet. The deposition flow was adjusted by sensing the pressure to equal exactly 10 Torr during deposition. The film-thickness was controlled by timing the deposition time. A deposition time of 3 minutes for the $PbI_2$ deposition was often used. After the $PbI_2$ deposition was finished we turned off the $N_2$ source flow and simultaneously turned on the side $N_2$ flow to keep the pressure constant. At the same time, we turned off the power source for the heating band to decrease the temperature of the middle source tube. Then we repeated the procedure in a similar manner with the MAI source tube. There we set the target source temperature to 210° C. and only waited 2 minutes to stabilize before starting with the deposition, which was also performed with adjusted $N_2$ flow to keep 10 Torr system pressure. The best results were achieved with a deposition time of 1:30 minutes. After turning off the source flow while turning on the side port flow and letting the temperature decrease we waited for 15 minutes before turning off the vacuum pump and opening the system to remove the substrate.

For the alternating sequential deposition method, the individual deposition steps of turning on and off the $N_2$ flows for the $PbI_2$ and MAI source tubes were alternatingly repeated up to 12 times (i.e., the $PbI_2$ deposition times were 15 seconds and the MAI deposition times were 8 seconds long). The temperatures of the source tubes were kept at the target temperatures but the $N_2$ flow valves were alternatingly opened and closed for the deposition durations.

Hole-Transporting Layer Deposition

For the fabrication of sandwiched solar cell devices, the hole-transporting layer was deposited on top of the perovskite films by spin-coating a solution with 8.5 wt % or 10 wt % spiro-OMeTAD in chlorobenzene and 30 mol % lithium bis(trifluoromethane-sulfonyl)imide and 80 mol % 4-tert-butylpyridine as additives, at 2000 rpm for 60 seconds in the $N_2$ atmosphere. The sample was dried overnight in a light-sealed desiccator.

Anode Fabrication 50 nm Au, or 120 nm Ag was thermally evaporated on top of spiro-OMeTAD as the top-electrode. The pressure was ca. $10^{-6}$ Torr and the evaporation rate close to 0.1 nm/s.

Results and Discussion

A multi-source vapor transport deposition system was developed that integrates the required features for the successful vapor transport deposition of perovskite materials. The design is presented in the 3D drawing of FIG. 6A. First, heated tubes were included, having nitrogen ports at the top that were long enough to allow for a uniform heating of the transport gas, which was flowing over the precursor materials, sublimating them into the vapor phase and carrying the sublimated molecules towards a temperature-controlled substrate.

The magnified cross section of the 3D drawing in FIG. 6C shows the inner components. The custom-made vaporizing capsules within the source tubes contained the source material which was surrounded by two silicon carbide (SiC) filter foam disks, which could be easily extracted and cleaned for optimal uncontaminated operation. The lower filter disc was used to prevent the un-sublimated solid materials to escape the source tube, while the upper filter permitted better uniform gas flow and temperature distribution of the transport gas within the sublimation capsule. A temperature-controlled liquid was circulated through the substrate stage to allow for precise substrate surface temperature, which enabled enhanced deposition and film- and crystal growth behavior.

The middle source tube was loaded with $PbI_2$ and the outer source tubes with $CH_3NH_3I$ (MAI) to form $CH_3NH_3PbI_3$ on the substrate. We created a pressure-controlled vacuum in the chamber by connecting a roughing vacuum pump and an additional nitrogen valve on the side of the system. The completely assembled setup of the tool is presented in the photograph of FIG. 6F. For better in-situ process control of the growing films we installed a white led light source and a CCD based camera on the two view-ports respectively. We used standard vacuum components for most of the construction of the system and tried to minimize the number of parts that needed to be custom designed.

The deposition process depended on the process parameters, such as the flow rate of nitrogen at the source tube inlets, the temperature of the heated source tubes, the pressure of the system, and the substrate temperature. Because this is a large parameter space, a fully coupled computational simulation of the momentum balance, the energy balance and the mass balance to predict the deposition behavior in the entire system was used. The thermodynamic characteristics of MAI and $PbI_2$ are known; these include mainly the enthalpy of sublimation, which was used to calculate the temperature-dependent vapor pressure of the materials. By setting the $PbI_2$ source temperature to 450° C. and $N_2$ flow rate to 10,000 SCCM, the MAI source temperature to 210° C. and $N_2$ flow rate to 10,000 SCCM, the substrate temperature to 100° C. and the system pressure to 10 Torr, we were able to compute the velocity field, the pressure field and the concentration field during the steady state deposition behavior within the VTD system and plot the results in FIG. 9A and FIG. 9B, for example. The simulation showed, for example, that the $PbI_2$ source tube flow rate needs to be high enough to avoid parasitic deposition of the material within the lowest part of the source tube after the sublimation capsule.

Figure 11A:
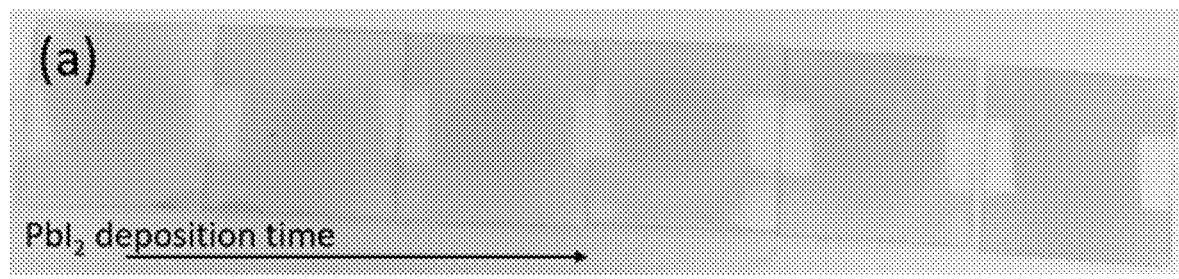
FIG. 11A is a photograph of a series of VTD deposited $PbI_2$ films with increasing deposition time.
Figure 11B:
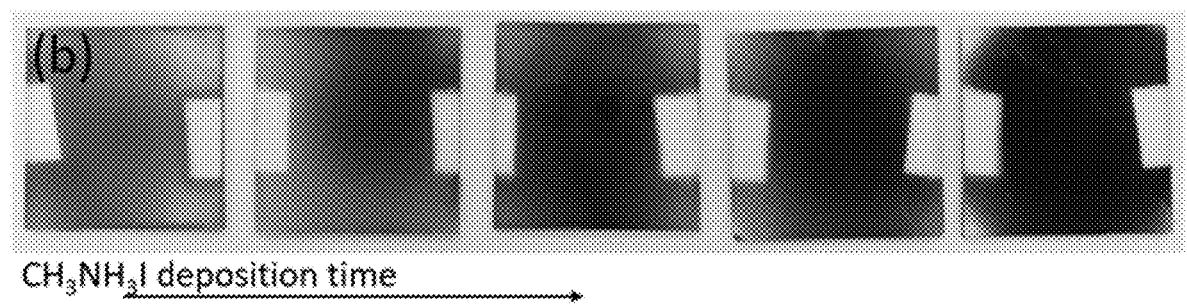
FIG. 11B is a photograph of a series of sequentially VTD deposited MAPI perovskite films with increasing MAI deposition time.
Figure 11C:
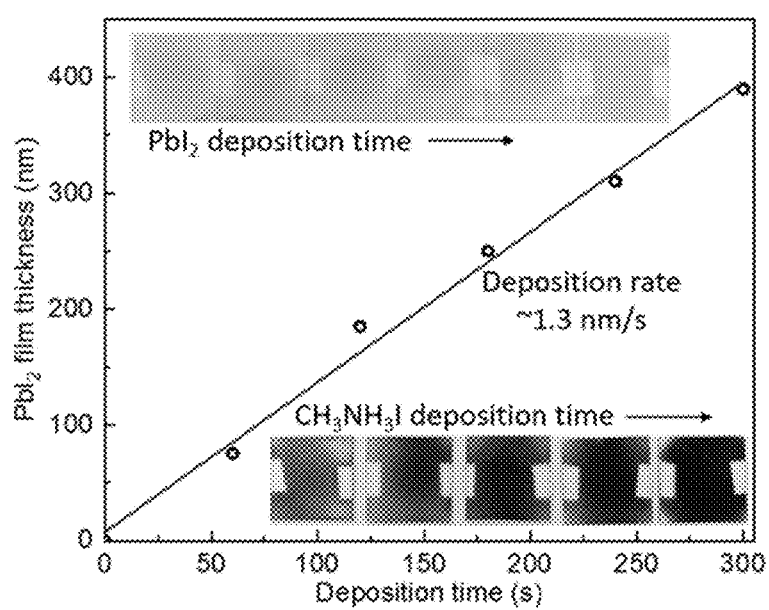
FIG. 11C is a graph of $PbI_2$ film thickness dependent versus VTD deposition time and linear fit to show growth rate.
Figure 11D:
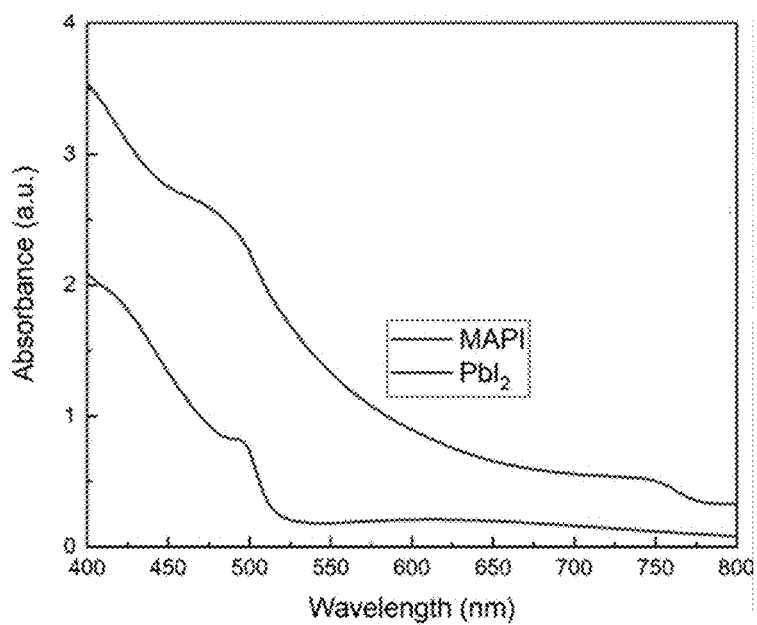
FIG. 11D are UV-vis absorbance spectra of a sequential VT deposited $PbI_2$ and MAPI film.
Figure 11E:
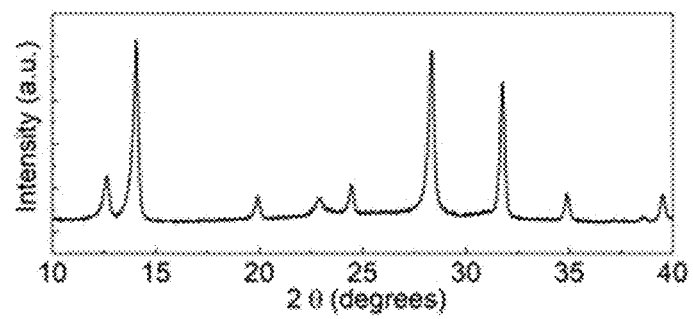
FIG. 11E is an XRD spectrum of a sequential VT deposited $PbI_2$ and MAPI film

After simulating the deposition behavior, sequential vapor transport deposition experiments of $PbI_2$ and MAI to form MAPI perovskite films were carried out. Different deposition time durations for the two materials were investigated by timing the amount of time the nitrogen carrier gas valve is open after the source tubes have been heated for at least 5 minutes ($PbI_2$) and 2 minutes (MAI) at the target temperatures. Increasingly thicker $PbI_2$ films are shown in the photographs of FIG. 9A; the thicknesses of these films, which were determined with a profilometer, for different deposition durations in are shown in FIG. 9B. The resulting linear growth behavior showed a growth rate of roughly 1.3 nm/s, which is about 10 times faster than the fastest demonstrations of thermally evaporated $PbI_2$ films. A $PbI_2$ film having a thickness of 200 nm, reached after 3 minutes of VTD, was used as the base to convert to MAPI films upon MAI VTD for different times. Films with $PbI_2$ excess, stoichiometric compositions, and compositions with excess of MAI are presented in the photographs of FIG. 11C. Compositional changes were observed optically and by measuring the X-ray diffraction patterns of these films, as shown in FIG. 11E.

Figure 11F:
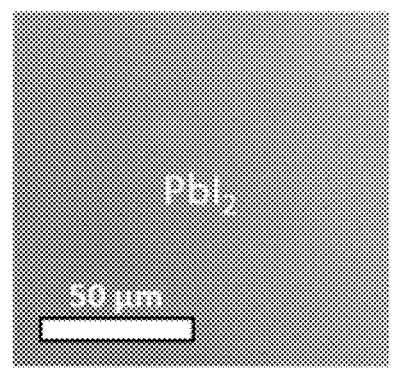
FIG. 11F is an optical micrograph of a $PbI_2$ and MAPI perovskite film deposited sequentially with VTD.
Figure 11G:
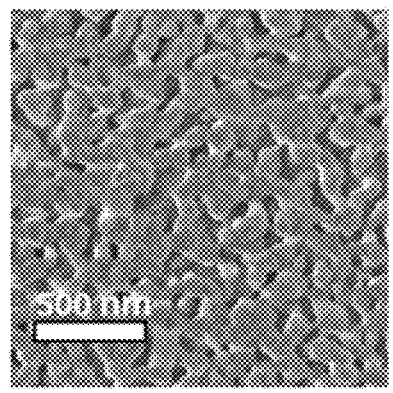
FIG. 11G is a SEM image of a $PbI_2$ and MAPI perovskite film deposited sequentially with VTD.
Figure 11H:
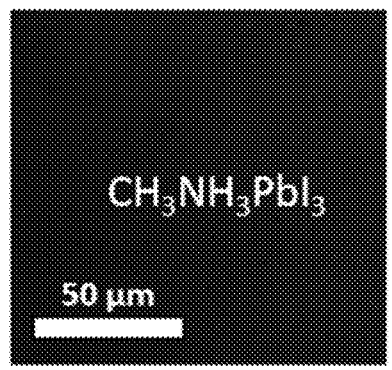
FIG. 11I is an optical micrograph of a $PbI_2$ and MAPI perovskite film deposited sequentially with VTD.
Figure 11I:
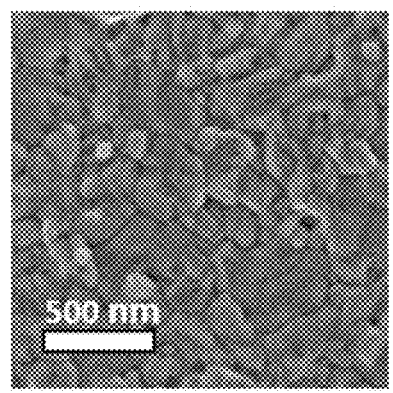

The morphologies of a vapor transport deposited $PbI_2$ film and its corresponding MAPI film were observed by 50x magnified optical microscopy and SEM imaging of the surfaces. The resulting images of $PbI_2$ (FIG. 11F and FIG. 11G) and MAPI (FIG. 11H and FIG. 11I) are shown in the figures. The $PbI_2$ morphology appears to be porous with ca. 100 nm large islands, which could allow for enhanced MAPI conversion due to larger available surface area. The morphology of MAPI appears to have high quality without pin-holes and with a perovskite crystal grain size of roughly 150-200 nm. Hence, these films should allow for well-functioning absorber layers in perovskite solar cell devices with less trap probability within the grain boundaries.

Sequential deposition of the two materials was compared to (i) alternating sequential deposition of thinner sequentially deposited layers, and (ii) simultaneous vapor transport deposition of the two materials with the correct stoichiometric molecular rate (tunable by flow rate and source temperature), namely co-VTD.

Figure 12A:
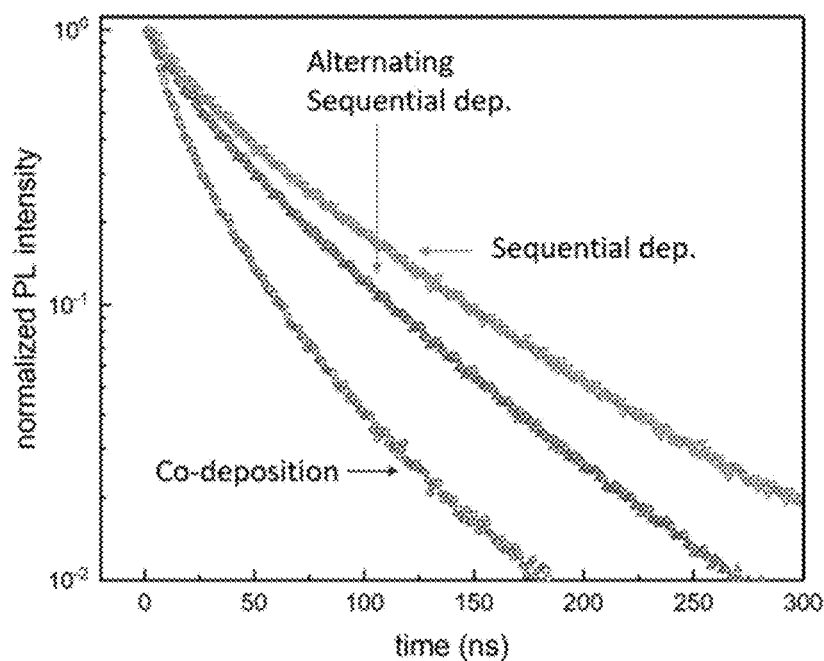
FIG. 12A is a graph showing the photoluminescence lifetimes of sequential, alternating sequential, and co-VTD deposited MAPI.

The films were analyzed with a time-resolved photoluminescence (PL) decay method. The PL decays are plotted in FIG. 12A and show that the charge carrier lifetime is consistent with films fabricated in a different way. Therefore, films made by the methods described herein have good opto-electronic properties. Combined with the previously assessed high quality of morphology, the films should be useful in producing MAPI perovskite solar cells.

Figure 12B:
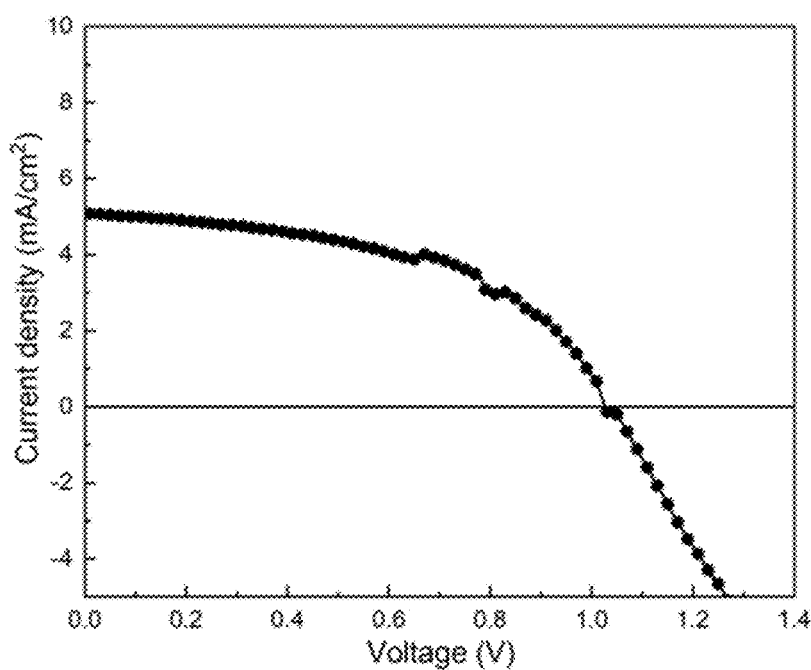
FIG. 12B is a graph showing the characteristic JV-curve of VT deposited perovskite based device under simulated AM1.5 sunlight.

Solar cell devices were fabricated. They included the VT deposited MAPI films by using FTO coated glass, depositing a $TiO_2$ compact electron transporting layer by spin-coating and high-temperature annealing underneath, and spin-coating the MAPI layer with a Spiro-OMeTAD hole-transporting layer before thermally evaporating a gold top contact. The resulting devices were tested by J-V characterization under simulated AM1.5 weighted sunlight and there results are plotted in FIG. 12B. The well-functioning device has a PCE of 2.7% coming from a high short circuit current of 5.1 $mA/cm^2$ and the notable VOC of 1.0 V, indicating low recombination losses due to defect states or surface recombination.

Example 2—Effect of Thickness of $PbI_2$ Layers on Ultimate Material Properties

In order to produce very thick perovskite films (needed to absorb more light) very thick $PbI_2$ layers were deposited and then exposed to MAI deposition. However, with high MAI deposition speeds, the films did not fully convert to perovskite but instead remained yellow (i.e., the color of unconverted $PbI_2$) on the bottom (visible through glass substrate) and with excess MAI on the surface. Films with inconsistent material properties are not useful for solar cell devices.

Example 3—Temperature Distribution in the Vaporization Capsule

Figure 13:
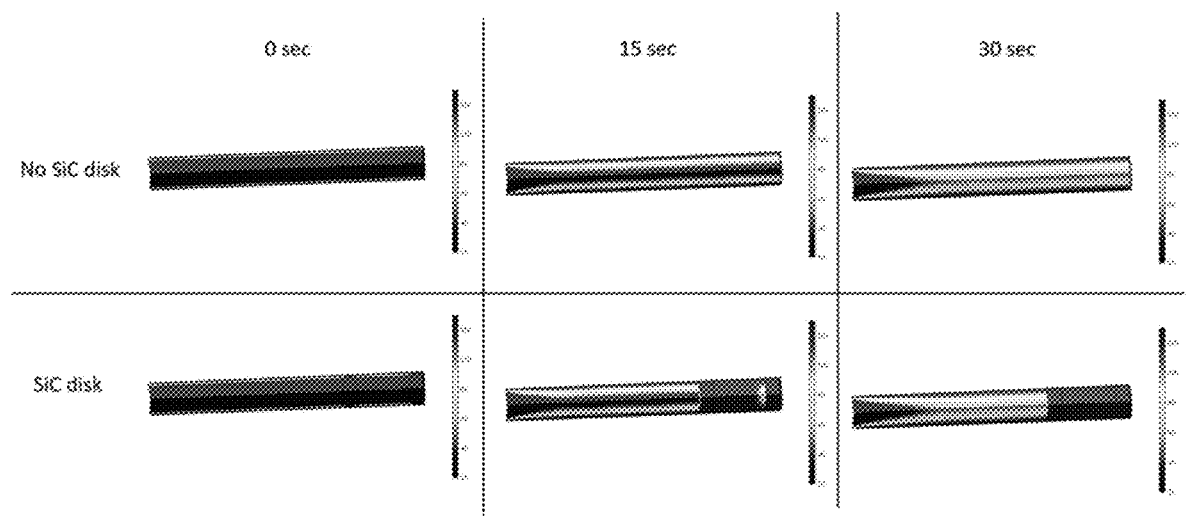
FIG. 13 is a computational fluid dynamic simulation demonstrating the temperature distribution over time in a source tube without (upper row) and with (lower row) porous SiC disk.

Initially, only one SiC filter was used to block the vaporization materials from entering the deposition chamber before being vaporized. However, the temperature profile of the carrier gas was simulated to be not uniform even if very long heating tubes are used. By randomly simulating different positions of the SiC filter, it was determined that the temperature profile was very uniform once the gas passes the filter. Therefore, a second filter was added before the vaporization material. See FIG. 13.

Figure 15A:
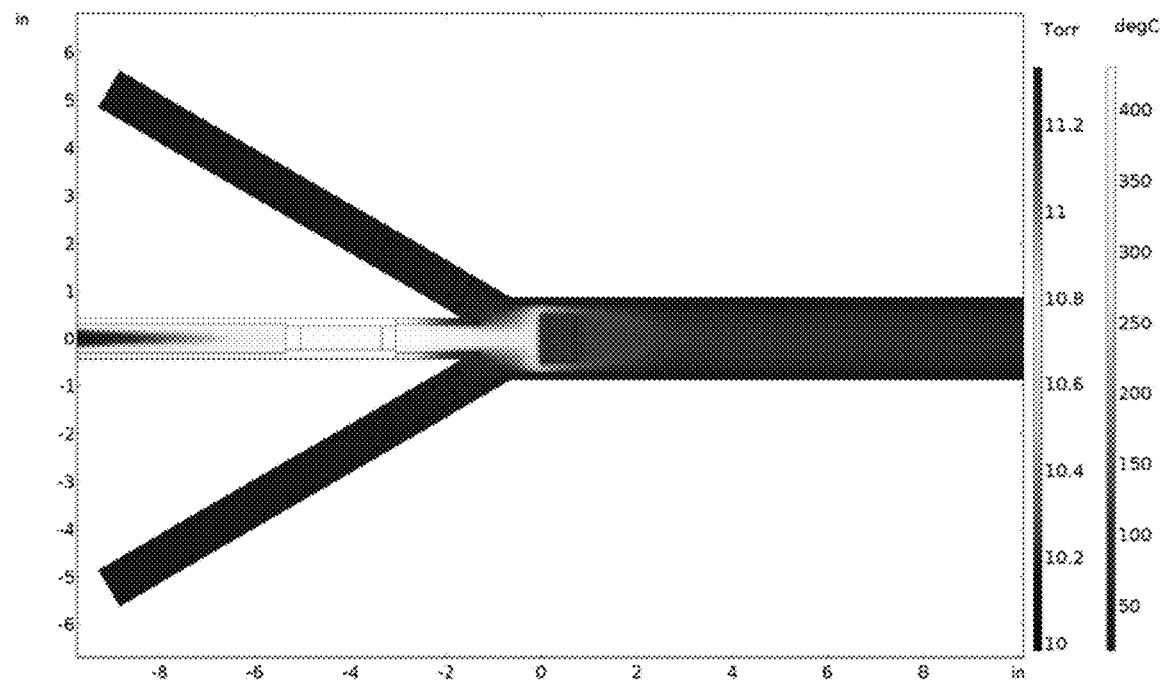
FIG. 15A is a computational fluid dynamic simulation of pressure and temperature of $PbI_2$ deposition.
Figure 15B:
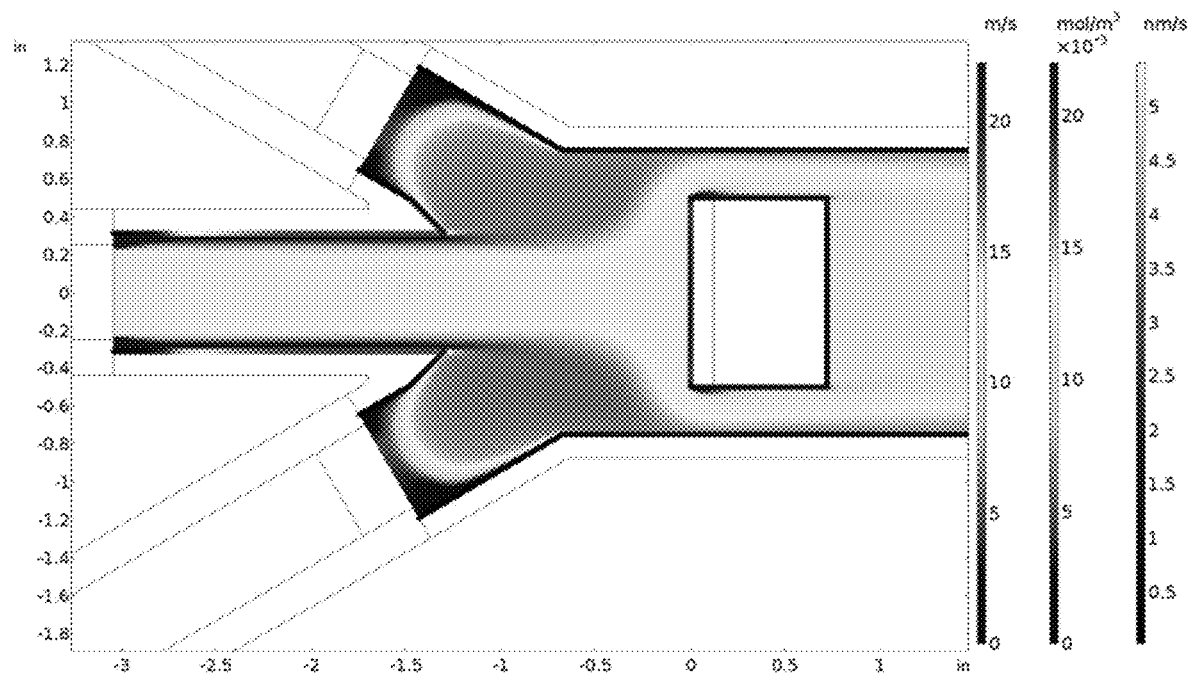
FIG. 15B is a computational fluid dynamic simulation of gas velocity, concentration, and deposition rate of $PbI_2$ deposition.
Figure 16A:
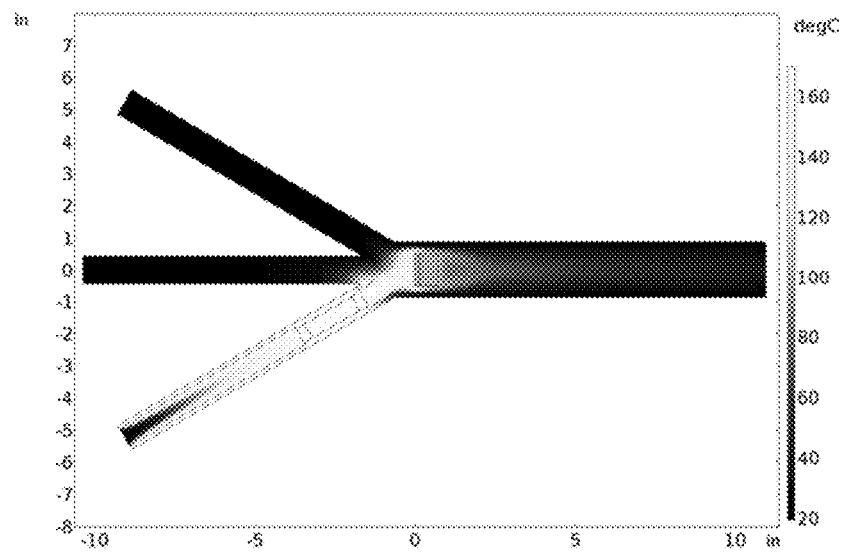
FIG. 16A is a computational fluid dynamic simulation of temperature of methylammonium iodide deposition.
Figure 16B:
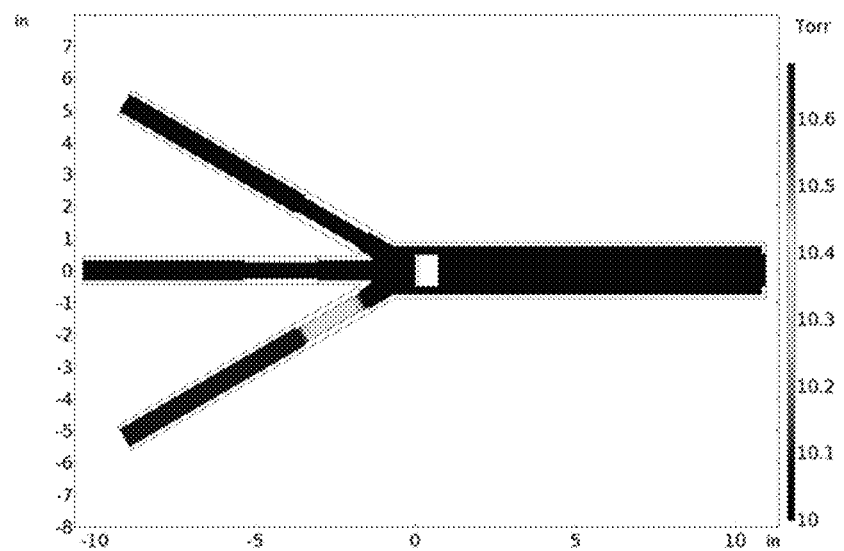
FIG. 16B is a computational fluid dynamic simulation of pressure of methylammonium iodide deposition.
Figure 16C:
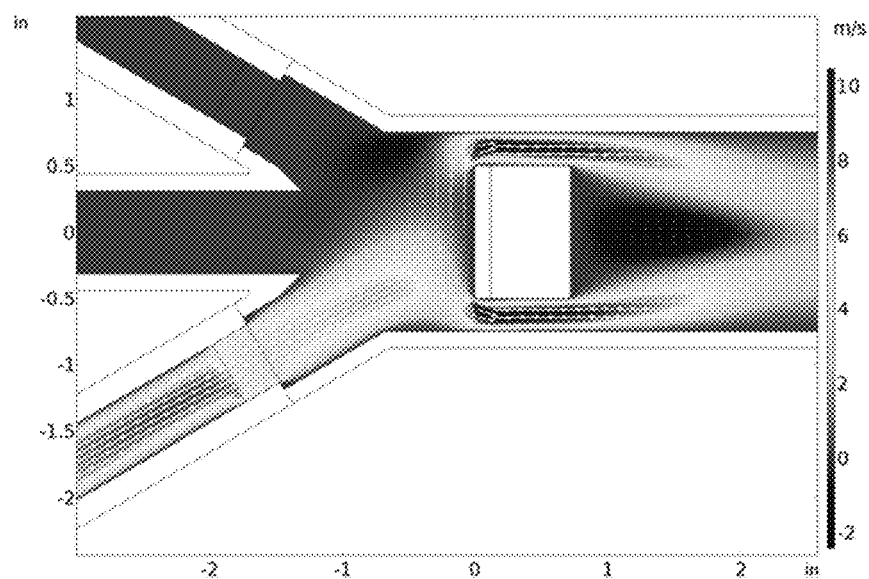
FIG. 16C is a computational fluid dynamic simulation of gas velocity of methylammonium iodide deposition.
Figure 16D:
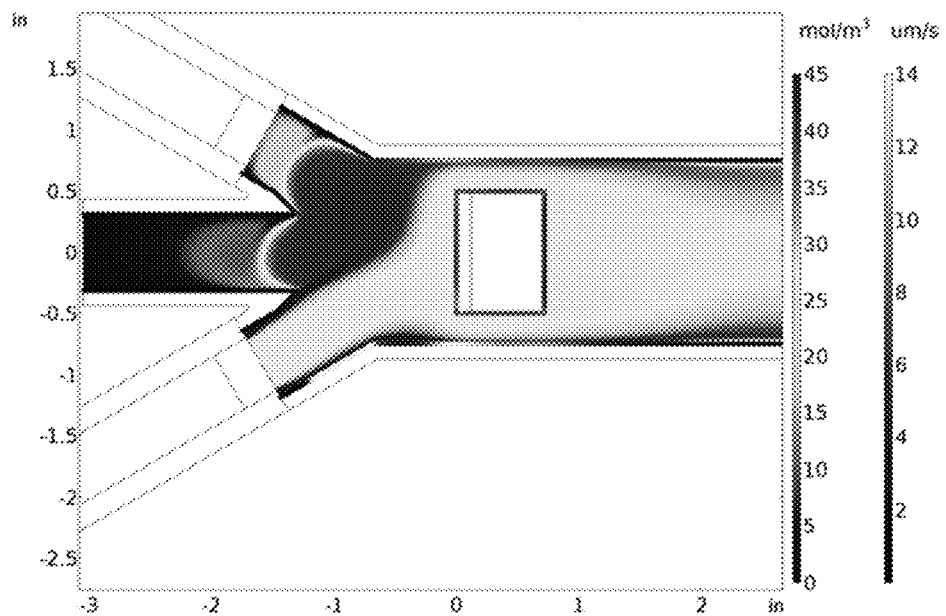
FIG. 16D is a computational fluid dynamic simulation of concentration and deposition rate of methylammonium iodide deposition.

Example 4—Simulation of the Velocity Field, Pressure Map, Temperature and Concentration Maps To predict the deposition behavior with these constraints, the velocity field, the pressure map, the temperature and the concentration maps within the VTD system at steady state with COMSOL is simulated. The simulation was accomplished by applying the following parameters: $PbI_2$ source temperature of 450° C. and $N_2$ flow rate of 2000 SCCM, the MAI source temperature of 170° C. and $N_2$ flow rate of 1000 SCCM, the substrate temperature of 100° C. and the system pressure of 10 Torr. The simulation results are plotted in FIG. 15A and FIG. 15B, which are both divided into halves, as the results are symmetrical. FIG. 15A shows the temperature map in the top half and the pressure field in the bottom half. The temperature varies substantially throughout the geometry. The high flow rate influences the temperature distribution at the inlet of the $PbI_2$ source tube, which is wrapped with heating tape and well controlled. However, the source cell shows perfectly uniform heating at the constant maximum temperature of 450° C., due to the choked flow through the SiC filters. The pressure is almost constant at the controlled value of 10 Torr throughout the geometry and only undergoes a slight increase through the filters at steady state. FIG. 15B shows the concentration map in the top half and the velocity map with field arrows in the bottom half.

It is additionally calculated that the deposition rate on the chamber walls and on the substrate stage and plotted it as color contour edge within the concentration map. The concentration map follows the shape of the velocity field. Hence the distribution of the highly diluted $PbI_2$ vapor within the N$_2$ carrier gas is mostly driven by the directional laminar flow. Only at the boundary layers is it driven by the concentration gradient, which is influenced by the temperature gradient. It is found that the deposition rate (shown as color-mapped boundaries in FIG. 15B) at the center of the substrate comes to roughly 1.5 nm/s and increases slightly at the edges. Due to the high vapor pressure of MAI, the deposition rate for a co-deposition is limited by the PbI$_2$ deposition and potentially the interdiffusion and crystal growth kinetics that have not yet been considered. When analyzing the deposition rate, very high parasitic deposition of the material within the part of the source tube after the source cell is encountered.

Example 5—Sequentially Deposited Perovskite Films

Perovskite films are sequentially deposited by first vapor transporting PbI$_2$ onto the substrate and then subsequently exposing it to a transported vapor stream of MAI to form MAPI perovskite films. This deposition sequence allows to adjust the right stoichiometric compositional combination of the materials by changing only the deposition times. In order to optimize the process and compare deposition rates with simulation results, the experiment started with different deposition time durations for the two materials. After preheating the source tubes for at least 5 minutes (PbI$_2$) or 2 minutes (MAI) to allow for steady state sublimation, the nitrogen carrier gas valves were opened for different deposition times. It is shown that the appearance of the increasingly thicker PbI$_2$ films in the inset photographs of FIG. 11C and plot their thicknesses, determined by a profilometer, as a function of the increasing deposition durations. The resulting linear growth behavior corresponds to a growth rate of 1.3 nm/s, which is about 10 times faster than demonstrations of thermally evaporated PbI$_2$ films. A PbI$_2$ film-thickness of ca. 200 nm, reached after 3 minutes of VTD, to convert to MAPI films was decided to be used. As discussed earlier, the PbI$_2$ deposition rate is the limiting process as the vapor pressure of MAI is substantially higher which corresponds to a much faster deposition speed. The increased duration of MAI VTD is leading to films with initial PbI$_2$ excess and then gradually changing to more stoichiometrically balanced compositions and then to compositions with an excess of MAI, as can be seen in the inset photographs of FIG. 11C. We examined the morphology of the optimal VTD PbI$_2$ film and converted MAPI film by 50$x$ magnified optical microscopy and SEM imaging of the surfaces. The resulting images of PbI$_2$ (FIG. 11F, FIG. 11G) and MAPI (FIG. 11H, FIG. 13I) are shown in FIGS. 11F-11I. The PbI$_2$ morphology appears to be porous with ca. 100 nm large islands, which could help to allow for enhanced MAPI conversion due to larger available surface area. Consequently, the pin-hole free morphology of MAPI appears to have a good quality perovskite crystal grain size of roughly 200 nm. Hence, these films should allow for well-functioning absorber layers in perovskite solar cell devices with less trap probability within the grain boundaries.

Example 6—Deposit an Alternating Sequence of Thin Pairs of Films

Figure 14A:
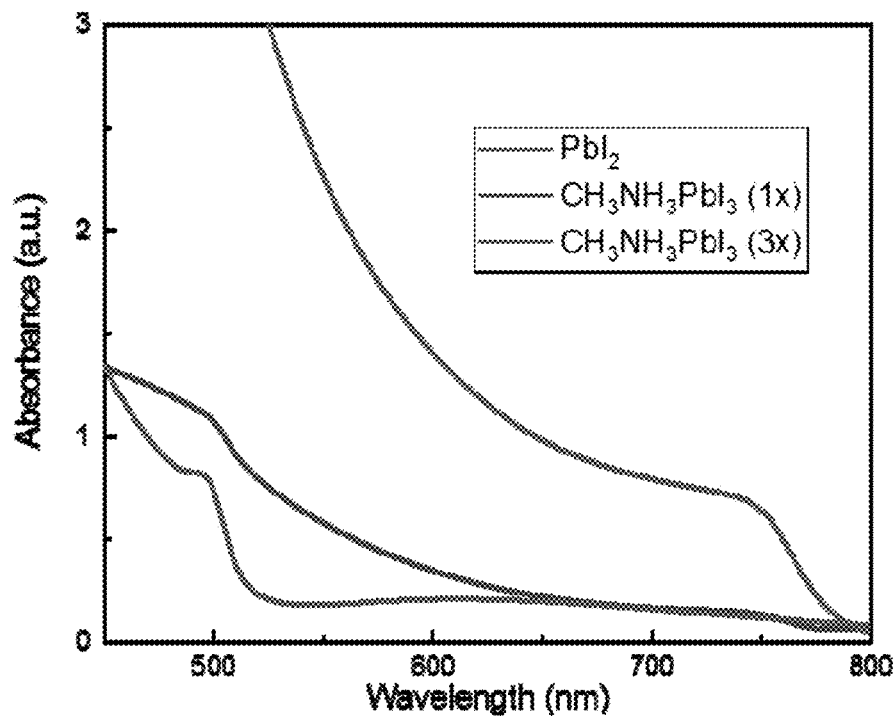
FIG. 14A is an UV-VIS absorbance spectrum of $PbI_2$ films and MAPI films produced via one sequential VT deposition and three alternating sequential VT depositions.
Figure 14B:
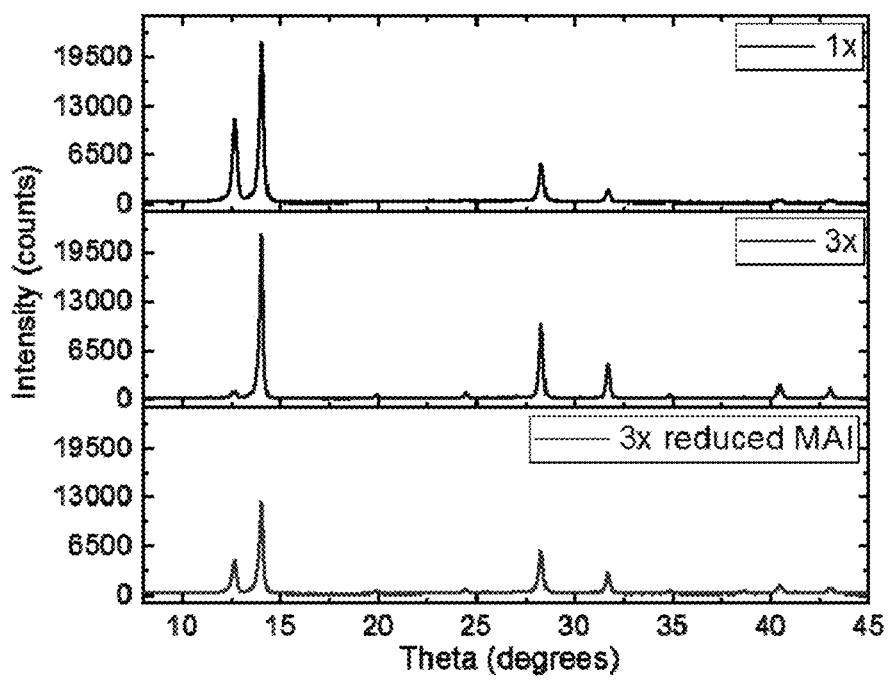
FIG. 14B is an X-ray diffraction spectrum of methylammonium iodide films produced via one sequential VT deposition and three alternating sequential VT depositions as well as three alternating sequential VT depositions with reduced methylammonium iodide exposure.

Pairs of PbI$_2$ and MAI three times were deposited in a row. To compare the optical properties of the resulting films, the UV-Vis absorbance spectra of bare PbI$_2$ films that were deposited via VTD, as well as a sequentially deposited layer of PbI$_2$ for 3 minutes and then vapor-transport (VT) depositing MAI for one minute and repeating the former procedure three times were measured. Results shown in FIG. 14A demonstrate that the alternating sequential VTD technique leads to perovskite films that absorb significantly more light. The absorbance onset suggests a band-gap edge at the wavelength of 780 nm (corresponding to 1.59 eV), which is in accordance with the typical properties of MAPI films. The VTD PbI$_2$ film shows a band-gap edge at 520 nm (corresponding to 2.39 eV). Compositional changes in the different MAPI films are measuring by the X-ray diffraction (XRD) patterns, as shown in FIG. 14B. The three times alternated sequentially deposited perovskite films are more crystalline, as evidenced by the diminishment of the lead iodide peak. The MAI deposition time was reduced slightly to see the effect in the XRD spectrum and find that the perovskite phase is negatively influenced, as apparent by the reduced MAPI peak at 14°.

Figure 14C:
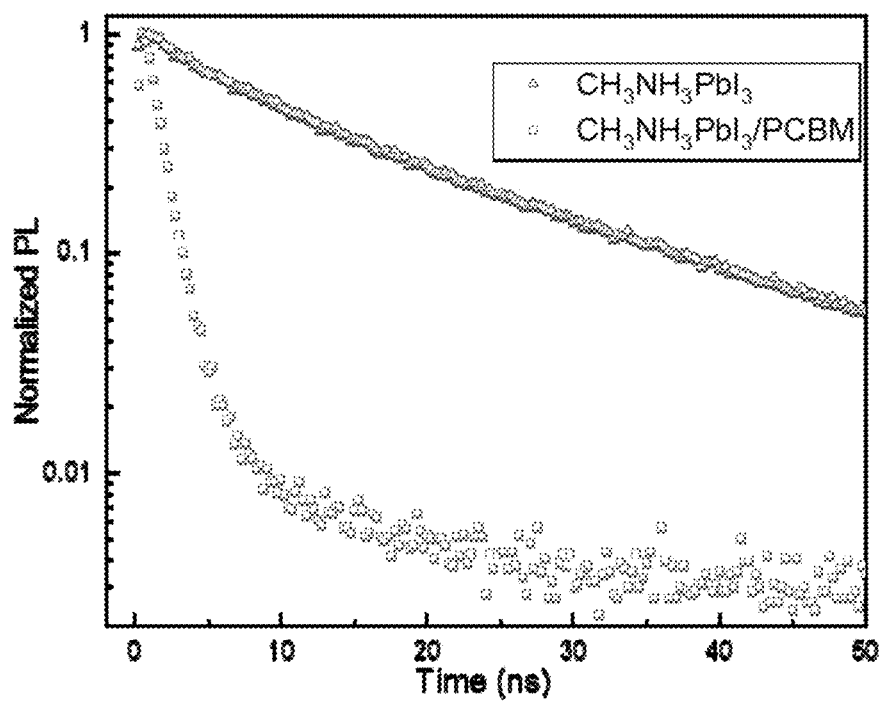
FIG. 14C is a plot of the time-resolved photoluminescence decay of VTD deposited methylammonium iodide films with and without an electron transporting quenching layer.

FIG. 14C plots the PL decays of a bare VTD MAPI film together with an equivalent film that has been covered with PCBM, a typical electron transporting layer. The fast decay of the PCBM covered film suggests good charge carrier extraction through the top interface.

Figure 14D:
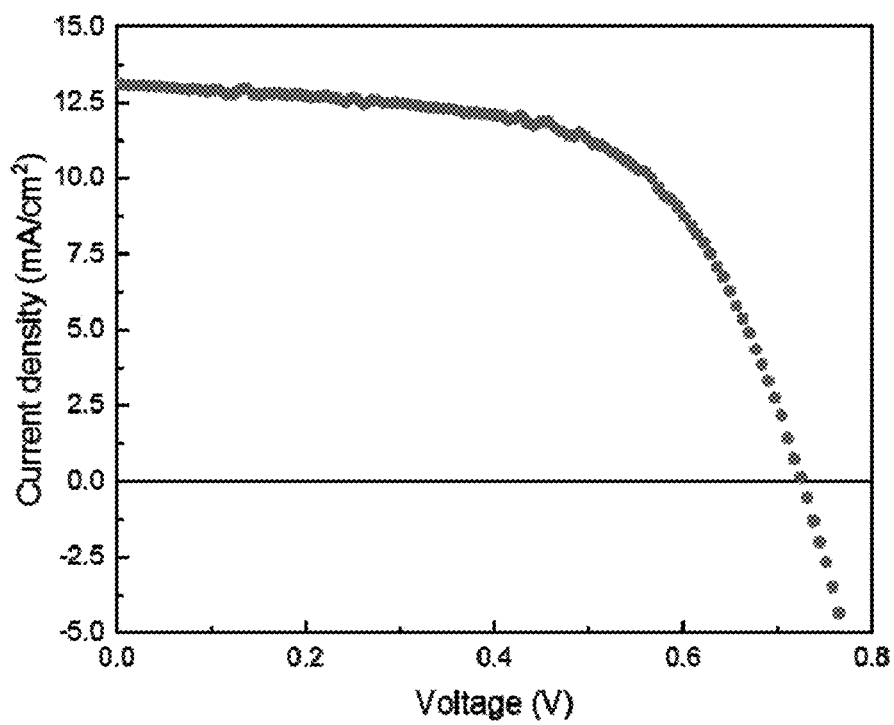
FIG. 14D is a characteristic JV-curve of VT deposited perovskite solar cell device under simulated AM1.5 sunlight with cross-sectional SEM image of the device stack (inset).

Above results indicate that VTD MAPI films have good opto-electronic properties and good morphology, which could lead to well-performing MAPI perovskite solar cells. To fabricate solar cells with VTD MAPI films we start with FTO coated glass on top of which a TiO$_2$ compact electron transporting layer is spin-coated and high-temperature annealed. The VTD MAPI layer is then deposited and capped with a spin-coated Spiro-OMeTAD hole-transporting layer and a thermally evaporated gold top contact. The device stack is shown in the inset cross-sectional SEM image of FIG. 14D, with the J-V characterization under simulated AM1.5 weighted sunlight plotted in FIG. 14D. The functioning device has a PCE of 6.9%, coming from a short circuit current (J$_{SC}$) of 14.2 mA/cm$^2$, and a notably good open-circuit voltage (V$_{OC}$) of 1.01 V, indicating low recombination losses due to defect states or surface recombination. The fill factor (FF) of 0.48 is significantly lower than current high-performance results and the shape of the curve indicates that there are substantial parasitic series resistances. Together with the relatively low J$_{SC}$ this indicates inefficient charge extraction at one of the interfaces, which could be caused by an energy barrier from unoptimized perovskite compositions that still contain excess of MAI or PbI$_2$ and need to be improved by further optimizing the growth conditions.

Figure 17A:
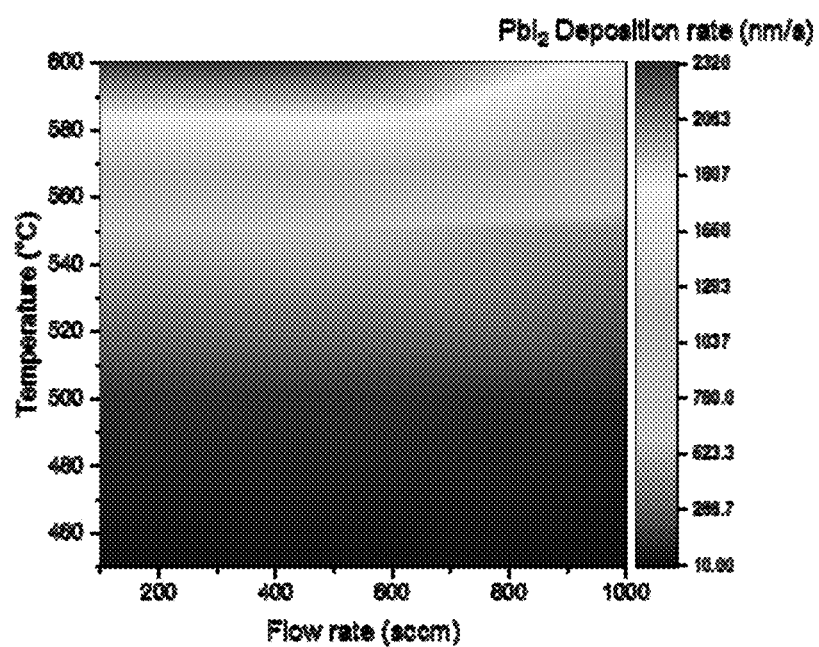
FIG. 17A is a computational fluid dynamic simulation of deposition rate as a function of source temperature and flow rate at chamber pressures of 0.1 Torr.
Figure 17B:
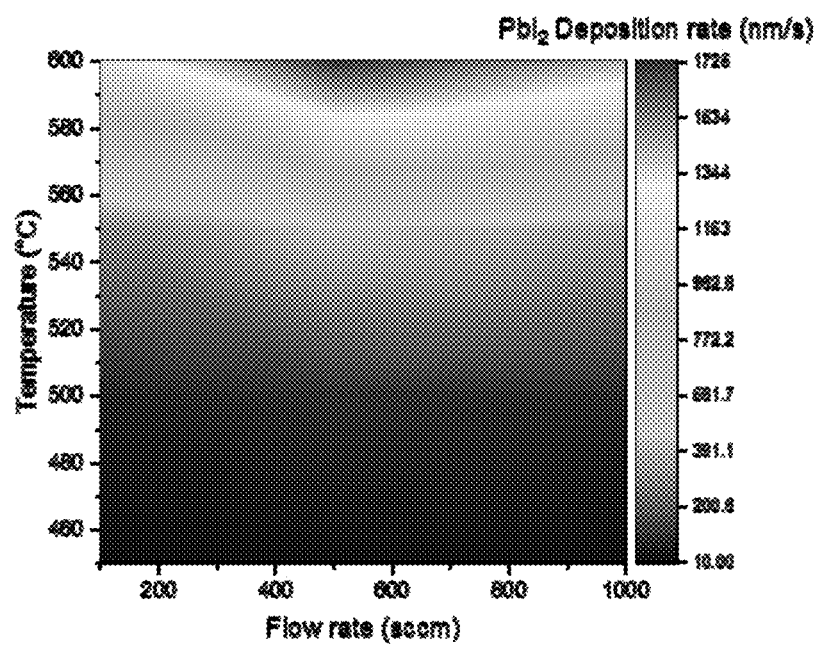
FIG. 17B is a computational fluid dynamic simulation of deposition rate as a function of source temperature and flow rate at chamber pressures of 1 Torr.
Figure 17C:
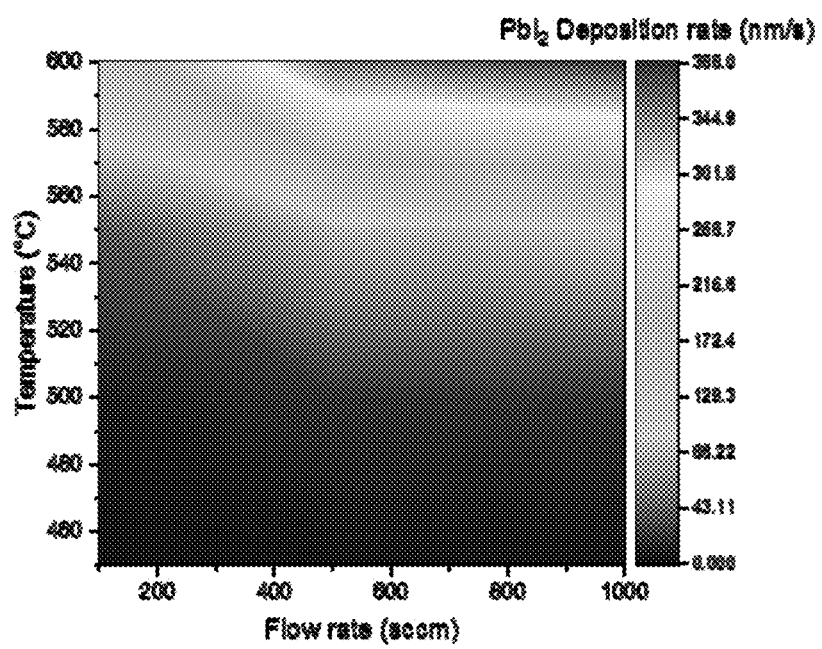
FIG. 17C is a computational fluid dynamic simulation of deposition rate as a function of source temperature and flow rate at chamber pressures of 10 Torr.

Example 7—Simulation of Optimized Elevated Source Tube Heating and Chamber Wall Heating to Minimize the Parasitic Chamber-Wall Deposition The scalability of perovskite film fabrication with this novel VTD technique is the core focus of the present work. In the present implementation, perovskite film growth rate is dependent on the deposition rate of PbI$_2$ films. Therefore, to explore the deposition rate limits, the processing conditions are changed within our computational model to allow for optimized elevated source tube heating and chamber wall heating to minimize the parasitic chamber-wall deposition during the film-growth process and maximize PbI$_2$ utilization. It is shown that the effect that the processing parameters have on the deposition rate, by plotting the latter for varied source temperature and carrier gas flow rate at three different chamber pressures of 0.1 Torr (FIG. 17A), 1 Torr (FIG. 17B), and 10 Torr (FIG. 17C). It is found that by numerically optimizing the processing conditions, remarkably high deposition rates of over 2 μm/s are possible. The trends indicate that lowering the chamber pressure has a strong effect on increasing deposition rates, which can be explained by the increased sublimation rate at lower chamber pressures. Additionally, at high chamber pressures, increasing the carrier gas flow rate has a slightly positive effect on the deposition rate but a peak is visible at around 500 sccm for chamber pressures of 1 Torr in which too high rates again lead to a declining trend. This is not surprising as there are competing effects influencing the deposition rate, so while the higher flow rates above 500 sccm lead to an increased sublimation rate, it also dilutes the vapor and leads to smaller concentrations in the deposition regime. Finally, increasing the source temperature has a very strong effect on the deposition rate, easily explained by the exponential dependence of sublimation on temperature. The limit would be reached at the decomposition temperature of $PbI_2$.

INCORPORATION BY REFERENCE

All of the U.S. patents and U.S. and PCT published patent applications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A method of making a perovskite film, comprising the steps of:
    (a) heating a metal halide in a first source tube at a first temperature from about 350° C. to about 480° C. at a first pressure from about $1 \times 10^{-4}$ Torr to about $1 \times 10^2$ Torr, thereby producing a sublimated metal halide;
    (b) flowing a first carrier gas from a first inlet through the first source tube and exposing a substrate to the sublimated metal halide and the first carrier gas at a second pressure from about $1 \times 10^4$ Torr to about $1 \times 10^2$ Torr, thereby forming a metal halide-coated substrate;
    (c) heating an organic halide in a second source tube at a second temperature from about 100° C. to about 250° C. at a third pressure from about $1 \times 10^{-4}$ Torr to about $1 \times 10^2$ Torr, thereby producing a sublimated organic halide; and
    (d) flowing a second carrier gas from a second inlet through the second source tube and exposing the metal halide-coated substrate to the sublimated organic halide and a second carrier gas at the second pressure from about $1 \times 10^{-4}$ Torr to about $1 \times 10^2$ Torr, thereby forming the perovskite film,
    wherein the metal halide is disposed between a first filter disc and a second filter disc in the first source tube; the organic halide is disposed between a first filter disc and a second filter disc in the second source tube; and each first filter disc and each second filter disc comprises silicon carbide (SiC),
    steps (b) and (d) are alternatingly repeated at least 3 times, and the perovskite film comprises an alternating sequence of deposited layer pairs.

2. The method of claim 1, wherein the metal halide is $PbI_2$, $PbBr_2$, $PbCl_2$, $SnI_2$, $SnBr_2$, $SnCl_2$, CsI, CsBr, or CsCl.

3. The method of claim 1, wherein the metal halide is $PbI_2$.

4. The method of claim 1, wherein the organic halide is methylammonium iodide (MAI), methylammonium bromide, methylammonium chloride, formamidinium iodide (FAI), formamidinium bromide, or formamidinium chloride.

5. The method of claim 1, wherein the organic halide is methylammonium iodide.

6. The method of claim 1, wherein the first carrier gas is $N_2$ or Ar.

7. The method of claim 1, wherein the second carrier gas is $N_2$ or Ar.

8. The method of claim 1, wherein the substrate is reversibly fastened to a temperature-controlled stage.

9. The method of claim 8, wherein the temperature of the temperature-controlled stage is from about 60° C. to about 150° C.

10. The method of claim 1, wherein the first pressure is about 10 Torr.

11. The method of claim 1, wherein the second pressure is about 10 Torr.

12. The method of claim 1, wherein the substrate is exposed to the sublimated metal halide and the first carrier gas for a first period of time.

13. The method of claim 12, wherein the first period of time is from about 1 millisecond to about 5 minutes.

14. The method of claim 12, wherein the first period of time is about 3 minutes.

15. The method of claim 14, wherein the metal halide coating is from about 50 nm to about 700 nm.

16. The method of claim 1, wherein the metal halide-coated substrate is exposed to the sublimated organic halide and the second carrier gas for a second period of time.

17. The method of claim 16, wherein the second period of time is from about 1 millisecond to about 3 min.

18. The method of claim 16, wherein the second period of time is about 90 seconds.

19. The method of claim 1, wherein the first source tube and the second source tube are oriented horizontally.

20. The method of claim 1, wherein the surface of the substrate is oriented vertically.

21. The method of claim 1, wherein steps (b) and (d) are repeated up to 12 times.

22. The method of claim 1, wherein steps (b) and (d) are repeated up to 50 times.

23. The method of claim 1, wherein the metal halide-coated substrate has a growth rate of at least 1.3 nm/s.

24. The method of claim 1, wherein the perovskite film has a perovskite crystal grain size of about 150-200 nm.

* * * * *